US012796514B2

(12) United States Patent
Wu et al.

(10) Patent No.: US 12,796,514 B2
(45) Date of Patent: Nov. 10, 2026

(54) 3D INTEGRATED CIRCUIT (3DIC) STRUCTURES AND METHODS FOR MANUFACTURING THE SAME

(71) Applicant: SAMSUNG ELECTRONICS CO., LTD., Suwon-si (KR)

(72) Inventors: Chengtar Wu, Suwon-si (KR); Jongkook Kim, Suwon-si (KR); Choongbin Yim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 373 days.

(21) Appl. No.: 18/493,234

(22) Filed: Oct. 24, 2023

(65) Prior Publication Data

US 2024/0258222 A1 Aug. 1, 2024

(30) Foreign Application Priority Data

Jan. 30, 2023 (KR) ........................ 10-2023-0012126

(51) Int. Cl.

| | |
|---|---|
| ***H10W 70/685*** | (2026.01) |
| ***H10W 72/20*** | (2026.01) |
| ***H10W 72/90*** | (2026.01) |
| ***H10W 90/00*** | (2026.01) |
| ***H10W 90/20*** | (2026.01) |

(52) U.S. Cl.

CPC ......... *H10W 70/685* (2026.01); *H10W 90/00* (2026.01); *H10W 90/701* (2026.01); *H10W 72/244* (2026.01); *H10W 72/923* (2026.01); *H10W 72/942* (2026.01); *H10W 90/297* (2026.01); *H10W 90/724* (2026.01)

(58) Field of Classification Search

None

See application file for complete search history.

(56) References Cited

U.S. PATENT DOCUMENTS

| | | | |
|---|---|---|---|
| 8,531,032 | B2 | 9/2013 | Yu et al. |
| 8,866,488 | B2 | 10/2014 | Wang et al. |
| 8,912,663 | B1 | 12/2014 | Lee et al. |

(Continued)

FOREIGN PATENT DOCUMENTS

| | | | |
|---|---|---|---|
| KR | 10-2019-0055728 | A | 5/2019 |
| KR | 10-2020-0138642 | A | 12/2020 |
| KR | 10-2022-0016689 | A | 2/2022 |

*Primary Examiner* — Bo B Jang

(74) *Attorney, Agent, or Firm* — Wolf, Greenfield & Sacks, P.C.

(57) ABSTRACT

A 3D integrated circuit structure, comprising: a redistribution layer structure; a first semiconductor chip die on the redistribution layer structure; a plurality of sacrificial pads on the redistribution layer structure; a plurality of conductive posts disposed adjacent the first semiconductor chip die, wherein the plurality of conductive posts is on the plurality of sacrificial pads, respectively; a molding material that is on the first semiconductor chip die, the plurality of sacrificial pads, the plurality of conductive posts, and the redistribution layer structure; an interconnection structure on the molding material; and a second semiconductor chip die on the interconnection structure, wherein the second semiconductor chip die overlaps the first semiconductor chip die and the plurality of conductive posts in a vertical direction.

12 Claims, 18 Drawing Sheets

100

(56) References Cited

U.S. PATENT DOCUMENTS

| | | | | |
|---|---|---|---|---|
| 9,202,716 | B2 | 12/2015 | Park et al. | |
| 9,299,682 | B2 | 3/2016 | Hung et al. | |
| 9,813,043 | B2 | 11/2017 | Zuo et al. | |
| 10,600,679 | B2 | 3/2020 | Kim et al. | |
| 10,867,890 | B2 | 12/2020 | Hwang et al. | |
| 11,217,563 | B2 | 1/2022 | Zhai | |
| 2015/0132892 | A1* | 5/2015 | Hung | H10P 54/00 438/113 |
| 2018/0138083 | A1* | 5/2018 | Kim | H10W 20/083 |
| 2019/0148330 | A1 | 5/2019 | Chen et al. | |
| 2020/0105689 | A1* | 4/2020 | Hwang | H10W 20/20 |
| 2022/0037306 | A1 | 2/2022 | You et al. | |
| 2022/0122918 | A1 | 4/2022 | Kwak et al. | |
| 2023/0067035 | A1 | 3/2023 | Chen et al. | |
| 2023/0253392 | A1 | 8/2023 | You et al. | |
| 2024/0355782 | A1 | 10/2024 | Chen et al. | |

* cited by examiner

100

100

100

100

100

100

100

100

100

100

100

3D INTEGRATED CIRCUIT (3DIC) STRUCTURES AND METHODS FOR MANUFACTURING THE SAME

CROSS-REFERENCE TO RELATED APPLICATION

This application claims priority to and the benefit of Korean Patent Application No. 10-2023-0012126 filed in the Korean Intellectual Property Office on Jan. 30, 2023, the entire contents of which are incorporated herein by reference.

BACKGROUND OF THE INVENTION

The present disclosure relates to 3D integrated circuit (3DIC) structures and methods for manufacturing the same.

A semiconductor industry sector seeks to improve integration density so that more passive or active devices may be integrated within a given region. However, development of technology for miniaturizing a circuit line width of a front end semiconductor process has gradually faced limitations so that the semiconductor industry sector is supplementing the limitations of the front end semiconductor process by developing technology of a semiconductor package that may have high integration density. Thus, 3D integrated circuit (3DIC) capable of reducing physical size of semiconductor element has been developed.

The 3D integrated circuit (3DIC) may be a stacked semiconductor device manufactured by dividing various components therein, such as a central processing unit (CPU), a graphics processing unit (GPU), a memory, a communication chip, a sensor, and the like into upper and lower wafers and performing an appropriate bonding process to bond the upper and lower wafers. The 3D integrated circuit (3DIC) may have a small form factor and provide great integration density to increase performance and reduce power consumption.

In the 3D integrated circuit (3DIC) having a stacked structure in which an area of a lower surface of an upper semiconductor chip die is larger than an area of an upper surface of a lower semiconductor chip die, the upper semiconductor chip die may be respectively coupled to the lower semiconductor chip die and a front side redistribution layer (FRDL) structure. The upper semiconductor chip die and the front side redistribution layer (FRDL) structure may be coupled by conductive posts (e.g., copper posts).

The conductive posts of the 3D integrated circuit (3DIC) may be formed by electroplating that requires a long turnaround time (TAT) and high cost. In order to reduce the turnaround time (TAT) for forming the conductive posts, a higher current per unit area may have to be applied during the electroplating.

However, in this case, height uniformity of the conductive posts may deteriorate, and an additional overmolding process and an additional grinding process may have to be performed to reduce height deviation of each conductive post so that additional cost may occur. In addition, the additional overmolding process and the additional grinding process may cause stress and crack in a bump structure below a lower semiconductor chip (e.g., the lower semiconductor chip die).

Therefore, it is necessary to develop a new 3D integrated circuit (3DIC) technology that may solve a problem of a conventional 3D integrated circuit (3DIC).

SUMMARY OF THE INVENTION

An embodiment is to provide a 3D integrated circuit (3DIC) structure and a method for manufacturing the same that form through holes in a molding material with a laser and fill the through holes with a conductive material to form metal posts (e.g., copper posts) electrically connecting an upper semiconductor chip die and a front side redistribution layer (FRDL) structure in the 3D integrated circuit (3DIC) having a stacked structure in which an area of a lower surface of the upper semiconductor chip die is larger than an area of an upper surface of a lower semiconductor chip die.

A 3D integrated circuit structure, comprising: a redistribution layer structure; a first semiconductor chip die on the redistribution layer structure; a plurality of sacrificial pads on the redistribution layer structure; a plurality of conductive posts disposed adjacent the first semiconductor chip die, wherein the plurality of conductive posts is on the plurality of sacrificial pads, respectively; a molding material that is on the first semiconductor chip die, the plurality of sacrificial pads, the plurality of conductive posts, and the redistribution layer structure; an interconnection structure on the molding material; and a second semiconductor chip die on the interconnection structure, wherein the second semiconductor chip die overlaps the first semiconductor chip die and the plurality of conductive posts in a vertical direction.

A width of an uppermost portion of a conductive post among the plurality of conductive posts is greater than or equal to a width of a lowermost portion of the conductive post.

The plurality of conductive posts include a hardened conductive paste.

The plurality of sacrificial pads include a conductive material, and the conductive material includes aluminum, tungsten, and/or an alloy thereof.

The plurality of conductive posts are adjacent a side surface of the first semiconductor chip die.

A first subset of conductive posts of the plurality of conductive posts are adjacent a first side surface of the first semiconductor chip die, and a second subset of conductive posts of the plurality of conductive posts are adjacent a second side surface of the first semiconductor chip die.

A 3D integrated circuit structure, comprising: a first redistribution layer structure; a molding material on the first redistribution layer structure; an interconnection structure on the molding material; a first semiconductor chip die in the molding material, wherein the first semiconductor chip die is electrically connected to the first redistribution layer structure and the interconnection structure; a plurality of sacrificial pads in the molding material, wherein the plurality of sacrificial pads are electrically connected to the first redistribution layer structure; a plurality of conductive posts in the molding material, wherein the plurality of conductive posts are adjacent the first semiconductor chip die, and wherein the plurality of conductive posts are electrically connected to the plurality of sacrificial pads and the interconnection structure; and a second semiconductor chip die on the interconnection structure, wherein the second semiconductor chip die overlaps the first semiconductor chip die and the plurality of conductive posts in a vertical direction.

The interconnection structure includes a second redistribution layer structure.

The interconnection structure includes a micro-bump.

The interconnection structure includes upper bonding pads and lower bonding pads.

The upper bonding pads and the lower bonding pads are directly in contact with each other, respectively.

The first semiconductor chip die includes a through silicon via (TSV).

A method for manufacturing a 3D integrated circuit structure, the method comprising: forming a first redistribution layer structure; forming a plurality of sacrificial pads on the first redistribution layer structure; providing a first semiconductor chip die on the first redistribution layer structure; forming a first molding material on the first semiconductor chip die and the plurality of sacrificial pads; forming through holes passing through the first molding material on the plurality of sacrificial pads; forming a plurality of conductive posts by filling the through holes with a conductive material; and electrically connecting a second semiconductor chip die to the first semiconductor chip die and to the plurality of conductive posts, wherein the second semiconductor chip die overlaps the first semiconductor chip die and the plurality of conductive posts in a vertical direction.

After the forming the first molding material on the first semiconductor chip die and the plurality of sacrificial pads, performing a chemical mechanical polishing (CMP) process on the first molding material.

The forming of the through holes passing through the first molding material on the plurality of sacrificial pads is performed by a laser.

The forming of the plurality of conductive posts by filling the through holes with the conductive material comprises: forming a seed metal layer; and performing electroplating.

The forming of the plurality of conductive posts by filling the through holes with the conductive material is performed by conductive paste printing.

The electrical connecting of the second semiconductor chip die to the first semiconductor chip die and to the plurality of conductive posts comprises: forming a second redistribution layer structure on the first semiconductor chip die and the plurality of conductive posts; and providing the second semiconductor chip die on the second redistribution layer structure.

The electrical connecting of the second semiconductor chip die to the first semiconductor chip die and to the plurality of conductive posts is performed by hybrid bonding.

The method may further include forming a second molding material on the second semiconductor chip die after the electrical connecting of the second semiconductor chip die to the first semiconductor chip die and to the plurality of conductive posts.

According to some embodiments, through holes may formed in a molding material with a laser and the through holes may be filled with a conductive material to form conductive posts (e.g., copper posts) electrically connecting an upper semiconductor chip die and a front side redistribution layer (FRDL) structure in a 3D integrated circuit (3DIC) having a stacked structure in which an area of a lower surface of the upper semiconductor chip die is larger than an area of an upper surface of a lower semiconductor chip die. Thus, a cost required for forming the conductive post may be reduced.

According to some embodiments, a via last structure in which vias (or conductive posts) is formed after planarizing the molding material may be adopted so that stress or crack formation in a bump structure below the lower semiconductor chip die that may occur when the molding material is planarized is reduced.

DETAILED DESCRIPTION OF THE EMBODIMENTS

Figure 1:
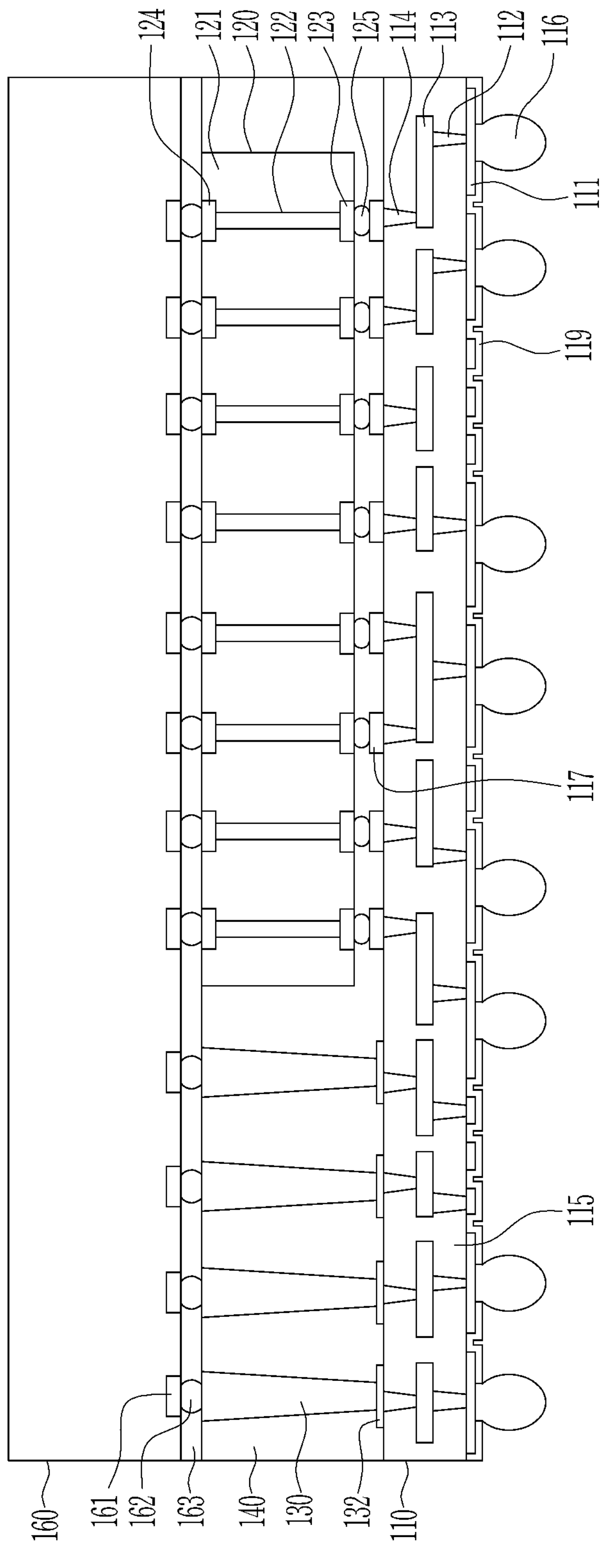
FIG. 1 is a cross-sectional view illustrating a 3D integrated circuit (3DIC) structure according to some embodiments of the present inventive concept.

The present disclosure will be described more fully hereinafter with reference to the accompanying drawings, in which embodiments of the disclosure are shown. As those skilled in the art would realize, the described embodiments may be modified in various ways, all without departing from the scope of the present disclosure.

In order to clearly describe the present disclosure, parts or portions that are irrelevant to the description may be omitted, and identical or similar constituent elements throughout the specification may be denoted by the same reference numerals unless clearly identified otherwise based on the context.

Further, for simplicity and clarity of illustration, each element may not be necessarily illustrated to scale, and the present disclosure is not necessarily limited to those illustrated in the drawings.

It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled,"

"directly connected," or "directly responsive" to, or "directly on," another element, there are no intervening elements present. In addition, "electrical connection" conceptually includes a physical connection and a physical disconnection. As used herein, the singular forms "a" and "an" are intended to include the plural forms as well, unless the context clearly indicates otherwise. In addition, unless explicitly described to the contrary, the word "comprise" and variations such as "comprises" or "comprising" will be understood to imply the inclusion of stated elements but not the exclusion of any other elements.

It will be understood that when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is disposed "directly on" or "directly on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is disposed "directly below" or "directly under" another layer, film, region, plate, or the like, the former directly contacts the latter and still another layer, film, region, plate, or the like is not disposed between the former and the latter. Further, in the specification, the word "on" or "above" may also mean positioned below or under the object portion, and does not necessarily mean positioned on the upper side of the object portion based on a gravitational direction.

Further, throughout the specification, the phrase "in a plan view" or "on a plane" may mean viewing a target portion from the top, and the phrase "in a cross-sectional view" or "on a cross-section" may mean viewing a cross-section formed by vertically cutting a target portion from the side.

Hereinafter, a 3D integrated circuit structure and a method for manufacturing the same according to some embodiments will be described with reference to the drawings.

The 3D integrated circuit (3DIC) structure 100 may implement an integrated circuit as a three-dimensional single chip and refer to a technology in which a circuit stacking method is converted from a conventional horizontal method to a vertical method. By using the vertical stacking method, more elements may be implemented in the same silicon wafer area so that manufacturing cost may be reduced and performance may be improved.

The 3D integrated circuit (3DIC) structure 100 may have a stacked structure in which an upper surface of a lower semiconductor chip die is larger than a lower surface of an upper semiconductor chip die or a stacked structure in which the lower surface of the upper semiconductor chip die is larger than the upper surface of the lower semiconductor chip die. In some embodiments, the upper surface of the lower semiconductor chip die may be same or substantially same as the lower surface of the upper semiconductor chip die. In the stacked structure in which the upper surface of the lower semiconductor chip die is larger than (or same or substantially same as) the lower surface of the upper semiconductor chip die, an entire lower surface of the upper semiconductor chip die may be bonded to the upper surface of the lower semiconductor chip die by a connection member (e.g., a micro-bump) disposed below the upper semiconductor chip die. However, in the stacked structure in which the lower surface of the upper semiconductor chip die is larger than the upper surface of the lower semiconductor chip die, an additional interconnection member may be required for a portion of the lower surface of the upper semiconductor chip die that is not bonded to the upper surface of the lower semiconductor chip die.

Conductive posts may be formed as the additional interconnection member. The conductive posts may include metal posts, for example, but not limited to, copper posts. In some embodiments, the conductive posts may be formed by electroplating that requires a long turnaround time (TAT) and high cost. In order to reduce the turnaround time (TAT) for forming the conductive posts, a higher current per unit area may be applied during the electroplating. However, in this case, the height uniformity of the conductive posts may deteriorate, and an additional overmolding process and an additional grinding process may have to be performed to reduce the height deviation of each conductive post so that additional cost may occur. In addition, the additional overmolding process and the additional grinding process may cause stress and crack in a bump structure below the lower semiconductor chip.

FIG. 1 is a cross-sectional view illustrating a 3D integrated circuit (3DIC) structure 100 having a stacked structure according to some embodiments of the present inventive concept in which an area of a lower surface of a second semiconductor chip die 160 disposed at an upper portion of the stacked structure may be larger than an area of an upper surface of a first semiconductor chip die 120 disposed at a lower portion of the stacked structure, the second semiconductor chip die 160 and a front side redistribution layer (FRDL) structure 110 may be electrically connected (e.g., coupled) to each other by conductive posts 130 that are adjacent (disposed at) one side (e.g., side surface) of the first semiconductor chip die 120 and are disposed on a sacrificial pad 132, and the conductive posts 130 and the first semiconductor chip die 120 may be bonded to the second semiconductor chip die 160 by first connection members 162.

Referring to FIG. 1, the 3D integrated circuit (3DIC) structure 100 may include the front side redistribution layer (FRDL) structure 110, the first semiconductor chip die 120, the conductive posts 130, a first molding material 140, the second semiconductor chip die 160, the first connection member 162, an insulating member 163, and an external connection member 116.

The front side redistribution layer (FRDL) structure 110 may include a first dielectric layer 115. The front side redistribution layer (FRDL) structure 110 may include first redistribution vias 112, first redistribution lines 113, and second redistribution vias 114 in the first dielectric layer 115. In some embodiments, first bonding pads 117 and sacrificial pads 132 may be disposed on (e.g., on an upper surface of) the first dielectric layer 115. In some embodiments, a redistribution layer structure (e.g., the front side redistribution layer (FRDL) structure 110) including a fewer or greater number of redistribution lines, a fewer or greater number of redistribution vias, a fewer or greater number of bonding pads, and a fewer or greater number of sacrificial pads, may be included within the scope of the present disclosure.

In some embodiments, second bonding pads 111 may be disposed on (e.g., on a lower surface of) the first dielectric layer 115. For example, the first bonding pads 117 and the second bonding pads 111 may be disposed on the opposite surfaces of the first dielectric layer 115 in a vertical direction that is perpendicular to the upper surface of the first dielectric layer 115. The first redistribution via 112 may be disposed between the first redistribution line 113 and the second bonding pad 111. The first redistribution via 112 may be electrically connected (e.g., coupled) to the first redistribution line 113 and the external connection member 116. The external connection member 116 may be disposed on the lower surface of the first dielectric layer 115 and may be electrically connect to the second bonding pad 111 in the vertical direction. The first redistribution line 113 may be disposed between the first redistribution via 112 and the second redistribution via 114. The first redistribution line 113 may be electrically connected (e.g., coupled) to the first redistribution via 112 and the second redistribution via 114 in a horizontal direction parallel with the upper surface of the first dielectric layer 115. The second redistribution via 114 may be disposed between the first redistribution line 113 and the first bonding pad 117 and/or between the first redistribution line 113 and the sacrificial pad 132. The second redistribution via 114 may be electrically connected (e.g., coupled) to the first redistribution line 113 and the first bonding pad 117 in the vertical direction, and/or electrically connected (e.g., coupled) to the first redistribution line 113 and the sacrificial pad 132 in the vertical direction. The first bonding pad 117 may be disposed between the second redistribution via 114 and a second connection member 125 and may be electrically connected (e.g., coupled) to the second redistribution via 114 and the second connection member 125. The sacrificial pad 132 may be disposed between the second redistribution via 114 and the conductive post 130 and may be electrically connected (e.g., coupled) to the second redistribution via 114 and the conductive post 130. In some embodiments, the plurality of conductive posts 130 may be on (e.g., electrically connected to or electrically coupled to) the plurality of the sacrificial pads 132, respectively. For example, each conductive post 130 of the plurality of the conductive posts 130 may be on (e.g., electrically connected to or electrically coupled to) each sacrificial pad 132 of the plurality of the sacrificial pads 132, respectively.

The first semiconductor chip die 120 may include first semiconductor chips 121, through silicon vias (TSVs) 122, lower bonding pads 123, upper bonding pads 124, and second connection members 125. In some embodiments, the first semiconductor chip 121 may include, for example, a central processing unit (CPU) or a graphics processing unit (GPU), but is not limited thereto. The through silicon via (TSV) 122 may be disposed between the lower bonding pad 123 and the upper bonding pad 124. The through silicon via (TSV) 122 may be electrically connected (e.g., coupled) to the lower bonding pad 123 and the upper bonding pad 124.

Since the second semiconductor chip die 160 may be disposed spaced apart from the front side redistribution layer (FRDL) structure 110 that transfers a signal and power in the 3D integrated circuit (3DIC) structure 100, the through silicon via (TSV) 122 may be disposed between the first semiconductor chips 121 of the first semiconductor chip die 120 and may be electrically connected to the second semiconductor chip die 160 so that a speed at which the second semiconductor chip die 160 receives a signal and power and responds to the signal and the power is increased.

The lower bonding pad 123 may be disposed between the TSV 122 and the second connection member 125, and may be electrically connected (e.g., coupled) to the TSV 122 and the second connection member 125. The upper bonding pad 124 may be disposed between the through silicon via (TSV) 122 and the first connection member 162. The upper bonding pad 124 may be electrically connected (e.g., coupled) to the through silicon via (TSV) 122 and the second semiconductor chip die 160 that is electrically connected to the first connection member 162. The second connection member 125 may be disposed between the lower bonding pad 123 and the front side redistribution layer (FRDL) structure 110. The second connection member 125 may be electrically connected (e.g., coupled) to the lower bonding pad 123 and the front side redistribution layer (FRDL) structure 110.

The conductive posts 130 may be disposed between the sacrificial pad 132 and the first connection member 162 and may be electrically connected (e.g., coupled) to the sacrificial pad 132 and the first connection member 162. In some embodiments, the conductive post 130 may include a hardened conductive paste. In some embodiments, the conductive post 130 may include, for example, copper, gold, silver, nickel, zinc, tin, aluminum, chromium, antimony, and/or an alloy thereof, but is not limited thereto.

The first molding material 140 may include (e.g., mold) the first semiconductor chip die 120 and the conductive posts 130 therein on the front side redistribution layer (FRDL) structure. For example, the first molding material 140 may be disposed on (e.g., may extend around) the first semiconductor chip die 120 and the conductive posts 130. In some embodiments, the first molding material 140 may include a thermosetting resin such as an epoxy resin. In some embodiments, the first molding material 140 may include an epoxy molding compound (EMC). However, the embodiments of the first molding material 140 of this inventive concept are not limited thereto.

The second semiconductor chip die 160 may include second semiconductor chips (not shown) and third bonding pads 161. In some embodiments, the second semiconductor chip (not shown) may include a communication chip or a sensor, but is not limited thereto.

An interconnection structure may be disposed between the first semiconductor chip die 120 and the second semiconductor chip die 160. The interconnection structure may include the first connection member 162. The first connection member 162 may be disposed between the third bonding pad 161 and the conductive post 130 and may be disposed between the third bonding pad 161 and the first semiconductor chip die 120. The first connection member 162 may be electrically connected (e.g., coupled) to the third bonding pad 161 and the conductive post 130 and may be electrically connected (e.g., coupled) to the third bonding pad 161 and the first semiconductor chip die 120. In some embodiments, the first connection member 162 may include a micro-bump. However, the embodiments of the first connection member 162 of the present inventive concept is not limited thereto.

The insulating member 163 may extend around (e.g., surround) the first connection member 162 between the second semiconductor chip die 160 and the conductive post 130 and between the second semiconductor chip die 160 and the first semiconductor chip die 120.

The external connection member 116 may be electrically connected (e.g., coupled) to the front side redistribution layer (FRDL) structure 110 and an external configuration. As used hereinafter, the terms “external/outside configuration”, “external/outside device”, “external/outside power”, “external/outside signal”, or “outside” are intended to broadly refer to a device, circuit, block, module, power, and/or signal that resides externally (e.g., outside of a functional or physical boundary) with respect to a given circuit, block, module, system, or device. The external connection member 116 may be electrically connected to the front side redistribution layer (FRDL) structure 110 through the second bonding pads 111 disposed on (e.g., below) a lower surface of the front side redistribution layer (FRDL) structure 110. An insulating layer 119 may include a plurality of openings for soldering. In some embodiments, the insulating layer 119 may include a solder resist. The insulating layer 119 may partially extend around the external connection member 116 on the second bonding pads 111. The insulating layer 119 may prevent the external connection member 116 from being short-circuited.

Figure 2:
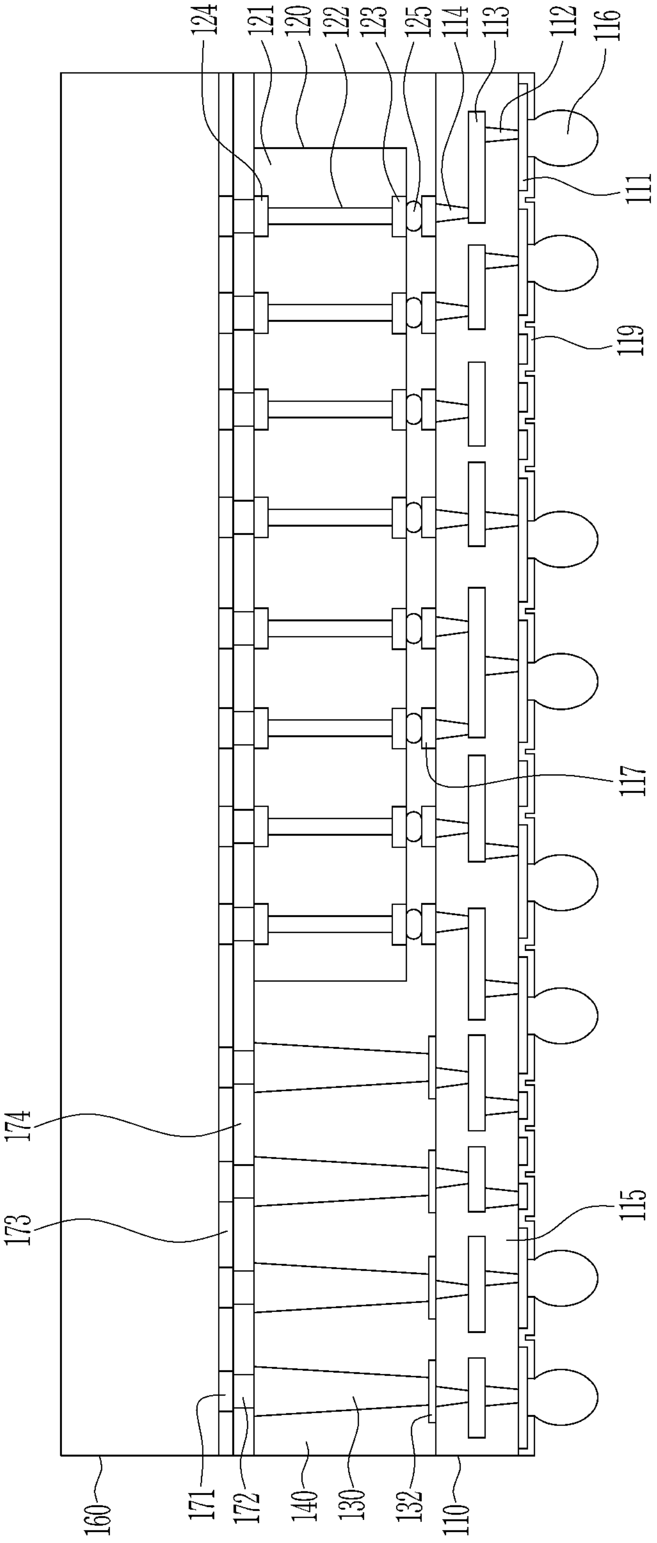
FIG. 2 is a cross-sectional view illustrating a 3D integrated circuit (3DIC) structure having a stacked structure according to some embodiments of the present inventive concept.

FIG. 2 is a cross-sectional view illustrating a 3D integrated circuit (3DIC) structure 100 having a stacked structure according to some embodiments of the present inventive concept in which the area of the lower surface of the second semiconductor chip die 160 disposed at the upper portion of the stacked structure may be larger than the area of the upper surface of the first semiconductor chip die 120 disposed at the lower portion of the stacked structure, the second semiconductor chip die 160 and the front side redistribution layer (FRDL) structure 110 may be electrically connected (e.g., coupled) to each other by the conductive posts 130 that are disposed at the one side of the first semiconductor chip die 120 and are disposed on the sacrificial pad 132, and the conductive posts 130 and the first semiconductor chip die 120 may be bonded to the second semiconductor chip die 160 by hybrid bonding.

Referring to FIG. 2, in the 3D integrated circuit (3DIC) structure 100, the conductive posts 130 and the first semiconductor chip die 120 may be bonded to the second semiconductor chip die 160 through the hybrid bonding. Interconnection structures between the first semiconductor chip die 120 and the second semiconductor chip die 160 and between the conductive posts 130 and the second semiconductor chip die 160 may include fourth bonding pads 171 and fifth bonding pads 172 and first silicon insulating layer 173 and second silicon insulating layer 174 and may be disposed on (e.g., at upper portions of) the conductive posts 130 and the first semiconductor chip die 120 and below the second semiconductor chip die 160.

The fifth bonding pads 172 may be directly in contact with (e.g., bonded to) the fourth bonding pads 171 by metal-metal hybrid bonding, and the second silicon insulating layer 174 may be directly bonded to the first silicon insulating layer 173 by non-metal-non-metal hybrid bonding.

In some embodiments, the fourth and fifth bonding pads 171 and 172 may include copper (Cu). In some embodiments, the fourth and fifth bonding pads 171 and 172 may be a metallic material to which the hybrid bonding may be applied. In some embodiments, the first and second silicon insulating layers 173 and 174 may include silicon oxide. In some embodiments, the first and second silicon insulating layers 173 and 174 may include $SiO_2$. In some embodiments, the first and second silicon insulating layers 173 and 174 may be a silicon nitride, a silicon oxynitride, or another suitable dielectric material.

A feature of a configuration of the 3D integrated circuit (3DIC) structure 100 of FIG. 1 described above may be equally applied to a configuration of the 3D integrated circuit (3DIC) structure 100 of FIG. 2 other than a configuration in which the conductive posts 130 and the second semiconductor chip die 160 are bonded and electrically connected (e.g., coupled) by the hybrid bonding, and the first semiconductor chip die 120 and the second semiconductor chip die 160 are bonded and electrically connected (e.g., coupled) by the hybrid bonding.

Figure 3:
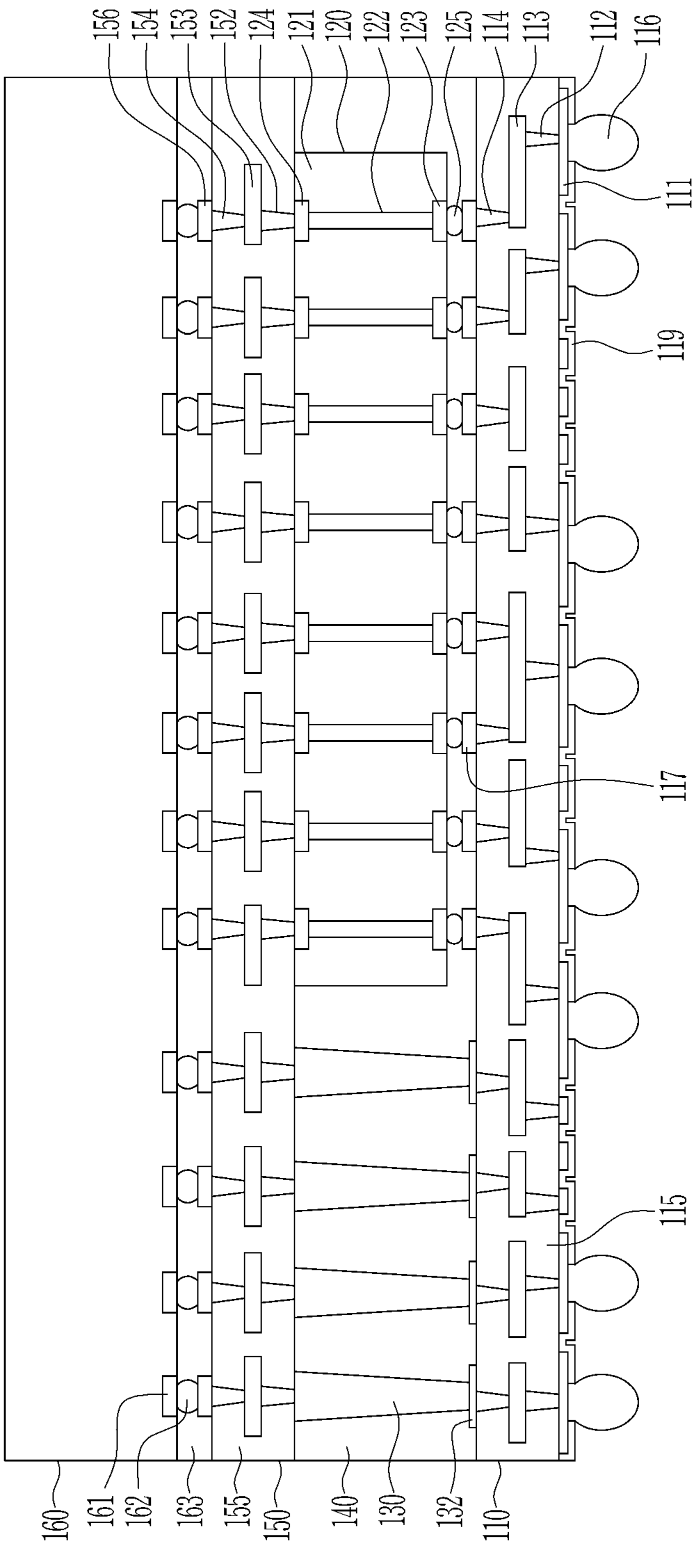
FIG. 3 is a cross-sectional view illustrating a 3D integrated circuit (3DIC) structure according to some embodiments of the present inventive concept.

FIG. 3 is a cross-sectional view illustrating a 3D integrated circuit (3DIC) structure 100 having a stacked structure according to some embodiments of the present inventive concept in which the area of the lower surface of the second semiconductor chip die 160 disposed at the upper portion of the stacked structure may be larger than the area of the upper surface of the first semiconductor chip die 120 disposed at the lower portion of the stacked structure, a back side redistribution layer (BRDL) structure 150 and the front side redistribution layer (FRDL) structure 110 may be electrically connected (e.g, coupled) to each other by the conductive posts 130 that are disposed at the one side of the first semiconductor chip die 120 and are disposed on the sacrificial pad 132, and the conductive posts 130 and the first semiconductor chip die 120 may be bonded to the second semiconductor chip die 160 by the back side redistribution layer (BRDL) structure 150.

Referring to FIG. 3, the conductive posts 130 and the first semiconductor chip die 120 may be bonded to the second semiconductor chip die 160 by the back side redistribution layer (BRDL) structure 150. In some embodiments, an interconnection structure may be disposed between the first semiconductor chip die 120 and the second semiconductor chip die 160. The interconnection structure may be disposed on the first molding material 140. The interconnection structure may include the back side redistribution layer (BRDL) structure 150. In some embodiments, the interconnection structure may include a micro-bump.

The back side redistribution layer (BRDL) structure 150 may include a second dielectric layer 155. The back side redistribution layer (BRDL) structure 150 may include third redistribution vias 152, second redistribution lines 153, and fourth redistribution vias 154 in the second dielectric layer 155 and sixth bonding pads 156 on (e.g., the upper surface of) the second dielectric layer 155. In some embodiments, a redistribution layer structure (e.g., the back side redistribution layer (BRDL) structure 150) including a fewer or greater number of redistribution lines, a fewer or greater number of redistribution vias, and a fewer or greater number of bonding pads may be included within a scope of the present disclosure.

The third redistribution via 152 may be disposed between the second redistribution line 153 and the upper bonding pad 124 and between the second redistribution line 153 and the conductive posts 130. The upper bonding pad 124 may be disposed between the third redistribution via 152 and the through silicon vias (TSVs) 122. The third redistribution via 152 may be electrically connected (e.g., coupled) to the second redistribution line 153 and the upper bonding pad 124 in the vertical direction and may be electrically connected (e.g., coupled) to the second redistribution line 153 and the conductive post 130 in the vertical direction. The second redistribution line 153 may be disposed between the third redistribution via 152 and the fourth redistribution via 154. The second redistribution line 153 may be electrically connected (e.g., coupled) to the third redistribution via 152 and the fourth redistribution via 154 in the horizontal direction. The fourth redistribution via 154 may be disposed between the second redistribution line 153 and the sixth bonding pad 156. The fourth redistribution via 154 may be electrically connected (e.g., coupled) to the second redistribution line 153 and the sixth bonding pad 156 in the vertical direction. The sixth bonding pad 156 may be disposed between the fourth redistribution via 154 and the first connection member 162 and may be electrically connected (e.g., coupled) to the fourth redistribution via 154 and the first connection member 162.

A feature of a configuration of the 3D integrated circuit (3DIC) structure 100 of FIG. 1 described above may be equally applied to a configuration of the 3D integrated circuit (3DIC) structure 100 of FIG. 3 other than a configuration in which the conductive posts 130 and the second semiconductor chip die 160 are bonded by the back side redistribution layer (BRDL) structure, and the first semiconductor chip die 120 and the second semiconductor chip die 160, are bonded by the back side redistribution layer (BRDL) structure.

Figure 4:
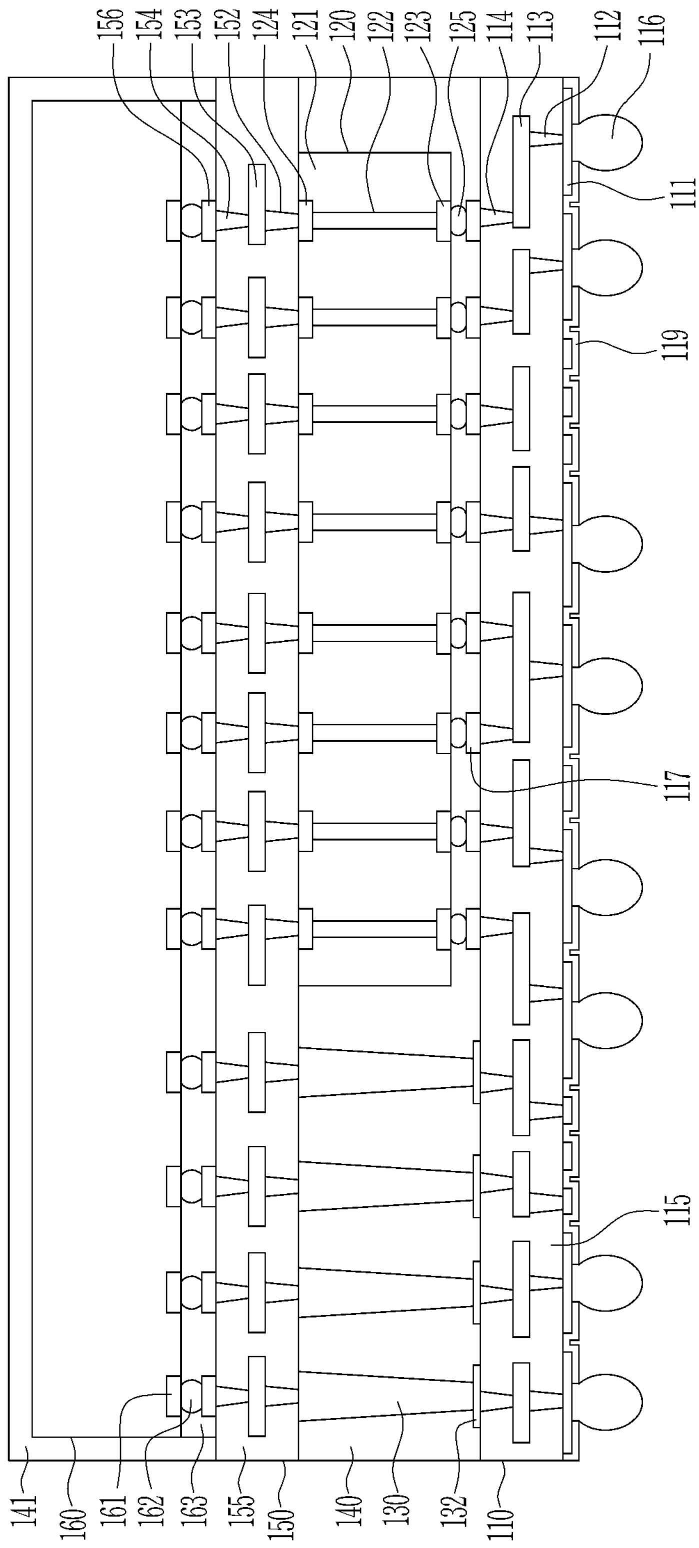
FIG. 4 is a cross-sectional view illustrating a 3D integrated circuit (3DIC) structure according to some embodiments of the present inventive concept.

FIG. 4 is a cross-sectional view illustrating a 3D integrated circuit (3DIC) structure 100 according to some embodiments of the present inventive concept in which the second semiconductor chip die 160 may be molded by a second molding material 141 on the back side redistribution layer (BRDL) structure 150 as difference from the 3D integrated circuit (3DIC) structure of FIG. 3. For example, the second molding material 141 may be disposed on (e.g., extend around) the second semiconductor chip die 160.

Referring to FIG. 4, the second semiconductor chip die 160 may be molded on the back side redistribution layer (BRDL) 150 by the second molding material 141. In some embodiments, the second molding material 141 may include a thermosetting resin such as an epoxy resin. In some embodiments, the second molding material 141 may include an epoxy molding compound (EMC). However, the embodiments of the second molding material 141 of this inventive concept are not limited thereto.

A feature of a configuration of the 3D integrated circuit (3DIC) structure 100 of FIG. 3 described above may be equally applied to a configuration of the 3D integrated circuit (3DIC) structure 100 of FIG. 4 other than a configuration in which the second semiconductor chip die 160 is molded by the second molding material 141.

Figure 5:
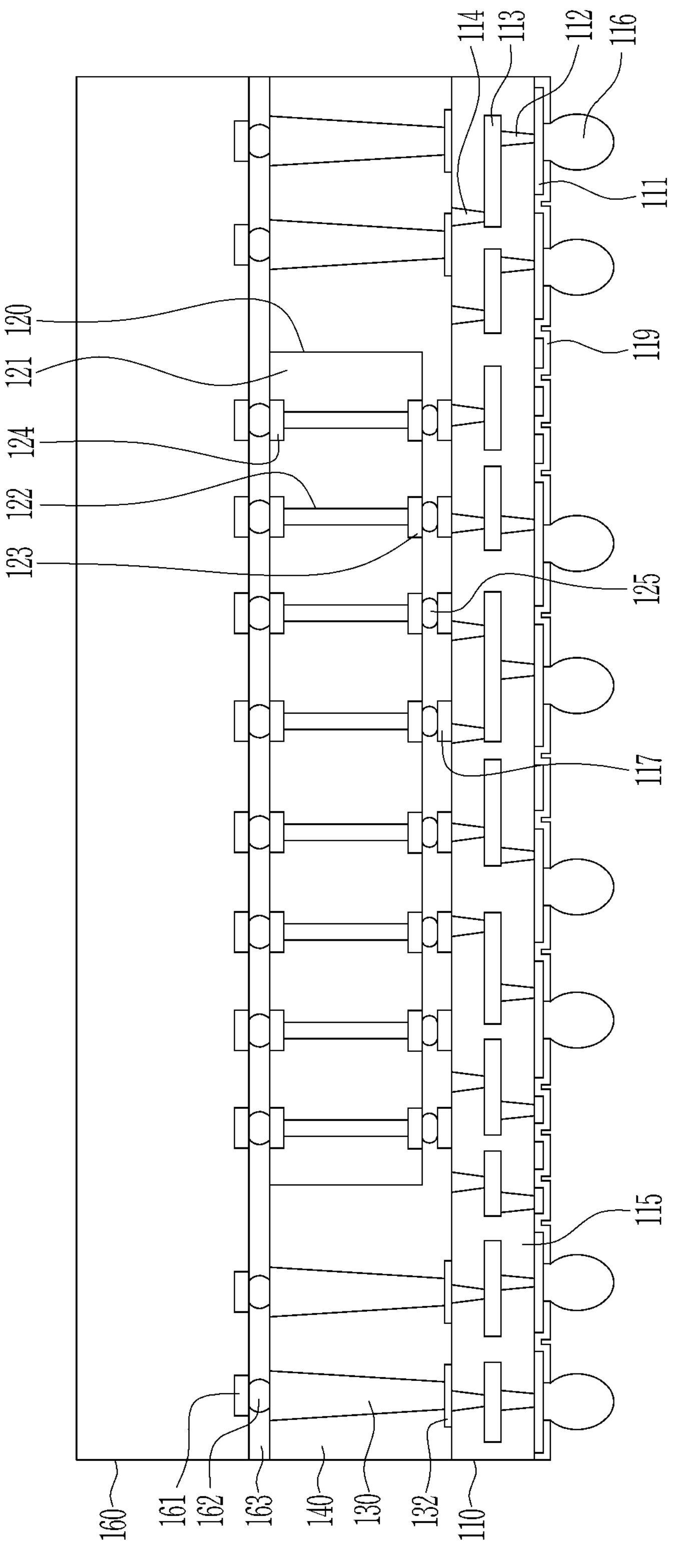
FIG. 5 is a cross-sectional view illustrating a 3D integrated circuit (3DIC) structure according to some embodiments of the present inventive concept.

FIG. 5 is a cross-sectional view illustrating a 3D integrated circuit (3DIC) structure 100 having a stacked structure according to some embodiments of the present inventive concept in which the area of the lower surface of the second semiconductor chip die 160 disposed at the upper portion of the stacked structure may be larger than the area of the upper surface of the first semiconductor chip die 120 disposed at the lower portion of the stacked structure, the second semiconductor chip die 160 and the front side redistribution layer (FRDL) structure 110 may be electrically connected (e.g., coupled) to each other by conductive posts 130 that are disposed next to side surfaces of the first semiconductor chip die 120 and on the sacrificial pad 132, and the conductive posts 130 and the first semiconductor chip die 120 may be bonded to the second semiconductor chip die 160 by the first connection members 162.

Referring to FIG. 5, the conductive posts 130 may be disposed adjacent (e.g., next to the side surfaces of) the first semiconductor chip die 120. For example, a first subset of conductive posts 130 may be adjacent a first side surface of the first semiconductor chip die 120 and a second subset of conductive posts 130 may be adjacent a second side surface of the first semiconductor chip die 120. Since the area of the lower surface of the second semiconductor chip die 160 disposed at the upper portion of the stacked structure may be larger than the area of the upper surface of the first semiconductor chip die 120 disposed at the lower portion of the stacked structure, various dispositions of the conductive posts 130 and the first semiconductor chip die 120 above the front side redistribution layer (FRDL) structure 100 may be implemented according to types, dispositions, connection relationships, or the like of the semiconductor chips included in the first semiconductor chip die 120 and the second semiconductor chip die 160. Accordingly, the conductive posts 130 may be disposed next to the side surfaces of the first semiconductor chip die 120, and a footprint of the first semiconductor chip die 120 and footprints of the conductive posts 130 may be included within a footprint of the second semiconductor chip die 160. For example, the second semiconductor chip die 160 may overlap (e.g., entirely overlap) the first semiconductor chip die 120 and the conductive posts 130 in the vertical direction.

Figure 6:
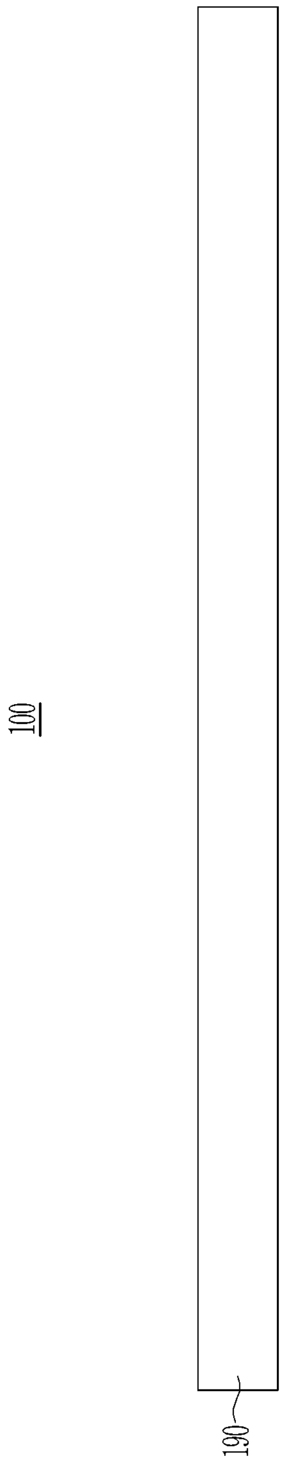
FIGS. 6-12 are cross-sectional views illustrating steps of a method for manufacturing the 3D integrated circuit (3DIC) structure according to some embodiments of the present inventive concept.

FIG. 6 is a cross-sectional view illustrating a step of providing a carrier 190 as one of steps of a method for manufacturing the 3D integrated circuit (3DIC) structure 100 according to some embodiments of the present inventive concept.

Referring to FIG. 6, the carrier 190 may be provided. For example, the carrier 190 may include a silicon-based material, such as glass or a silicon oxide, an organic material, another material, such as an aluminum oxide, any combination thereof, or the like. A release layer (not shown) may be disposed on the carrier 190. The release layer may include multiple layers, and for example, may include an adhesive layer and a release layer. The release layer may function to adhere the front side redistribution layer (FRDL) structure 110 and the carrier 190. The release layer may be removed along with the carrier 190 from the front side redistribution layer (FRDL) structure 110. An upper surface of the release layer may be flat, and may have a high coplanarity.

In some embodiments, the release layer may include a polymer-based material, but is not limited thereto. In some embodiments, the release layer may include a light-to-heat-conversion (LTHC) release coating material, and may be thermal-released by heating. In some embodiments, the release layer may include a UV adhesive that is peeled off by ultra-violet (UV) light. In some embodiments, the release layer may be peeled off by a physical method. In some embodiments, the release layer may be applied in a liquid and hardened state. In some embodiments, the release layer may be a laminate film disposed (e.g., laminated) on the carrier 190.

Figure 7:
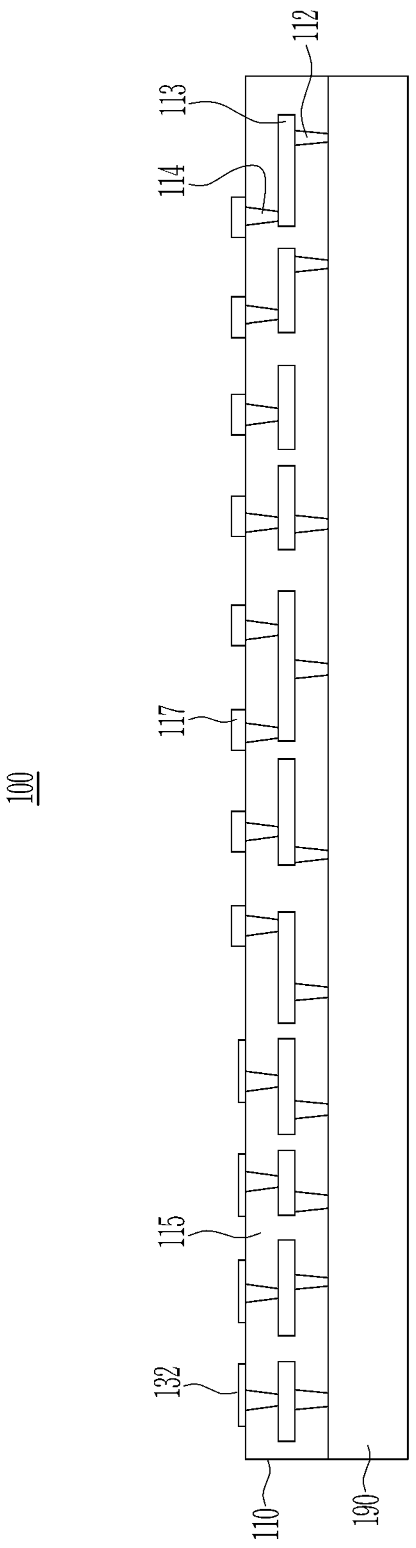

FIG. 7 is a cross-sectional view illustrating a step of positioning (e.g., providing) the front side redistribution layer (FRDL) structure 110 on the carrier 190 as one of steps of the method for manufacturing the 3D integrated circuit (3DIC) structure 100.

Referring to FIG. 7, the front side redistribution layer (FRDL) structure 110 may be disposed on the carrier 190.

First, the first dielectric layer 115 may be disposed on the carrier 190. In some embodiments, the front side redistribution layer (FRDL) structure 110 may include a photosensitive polymer layer. The photosensitive polymer may be a material capable of forming a fine pattern by applying a photolithography process. In some embodiments, the front side redistribution layer (FRDL) structure 110 may include a photoimageable dielectric (PID) used in a redistribution process. As an example, the photoimageable dielectric (PID) may include a polyimide-based photosensitive polymer, a novolac-based photosensitive polymer, polybenzoxazole, a silicone-based polymer, an acrylate-based polymer, or an epoxy-based polymer, but is not limited thereto. In some embodiments, the photoimageable dielectric (PID) may have a resolution of about 3 micrometers (μm). In some embodiments, the first dielectric layer 115 may include, for example, a polymer such as PBO, polyimide, or the like. In some embodiments, the first dielectric layer 115, may include, for example, an inorganic dielectric material, such as a silicon nitride, a silicon oxide, or the like. In some embodiments, the first dielectric layer 115 may be formed by, for example, a CVD, ALD, or PECVD process.

After the first dielectric layer 115 is formed, via holes may be formed by selectively etching the first dielectric layer

115, and the first redistribution vias 112 may be formed by filling the via holes with a conductive material.

Next, the first dielectric layer 115 may be additionally deposited on the first redistribution vias 112 and the (previously deposited) first dielectric layer 115, the additionally deposited first dielectric layer 115 may be selectively etched to form openings, and the first redistribution lines 113 may be formed by filling the openings with a conductive material.

Next, the first dielectric layer 115 may be additionally deposited on the first redistribution lines 113 and the (previously deposited) first dielectric layer 115, the additionally deposited first dielectric layer 115 may be selectively etched to form via holes, and the second redistribution vias 114 may be formed by filling the via holes with a conductive material.

In some embodiments, the first redistribution vias 112, the first redistribution lines 113, and the second redistribution vias 114 may include, for example, copper, aluminum, tungsten, nickel, gold, tin, titanium, and/or an alloy thereof. In some embodiments, the first redistribution vias 112, the first redistribution lines 113, and the second redistribution vias 114 may be formed by performing a sputtering process. In some embodiments, the first redistribution vias 112, the first redistribution lines 113, and the second redistribution vias 114 may be formed by performing an electroplating process after forming a seed metal layer.

Thereafter, the first bonding pads 117 and the sacrificial pads 132 may be disposed on the first dielectric layer 115 to be electrically connected (e.g., coupled) to the second redistribution vias 114 of the front side redistribution layer (FRDL) structure 110. The first bonding pads 117 may include, for example, copper, aluminum, silver, tin, gold, nickel, lead, titanium, and/or an alloy thereof. The sacrificial pads 132 may include, a conductive material, such as, aluminum, tungsten, and/or an alloy thereof. In some embodiments, the first bonding pads 117 and the sacrificial pads 132 may be formed by performing a sputtering process. In some embodiments, the first bonding pads 117 and the sacrificial pads 132 may be formed by performing an electroplating process after forming a seed metal layer.

Figure 8:
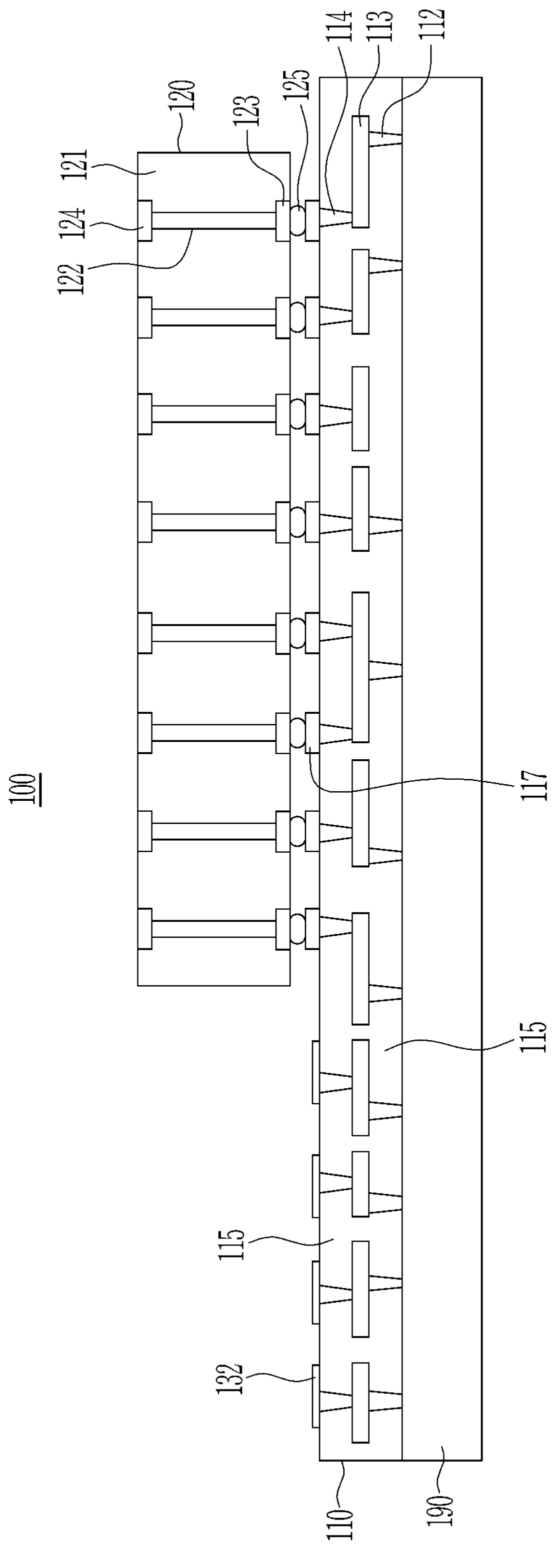

FIG. 8 is a cross-sectional view illustrating a step of positioning (e.g., mounting or providing) the first semiconductor chip die 120 on the front side redistribution layer (FRDL) structure 110 as one of steps of the method for manufacturing the 3D integrated circuit (3DIC) structure 100 according to some embodiments of the present inventive concept.

Referring to FIG. 8, the first semiconductor chip die 120 may be disposed (e.g., mounted) on the front side redistribution layer (FRDL) structure 110. Specifically, the first bonding pad 117 of the front side redistribution layer (FRDL) structure 110 and the lower bonding pad 123 of the first semiconductor chip die 120 may be bonded by the second connection member 125 to be electrically connected (e.g., coupled) to each other. In some embodiments, the second connection member 125 may include a micro-bump, but is not limited thereto.

Figure 9:
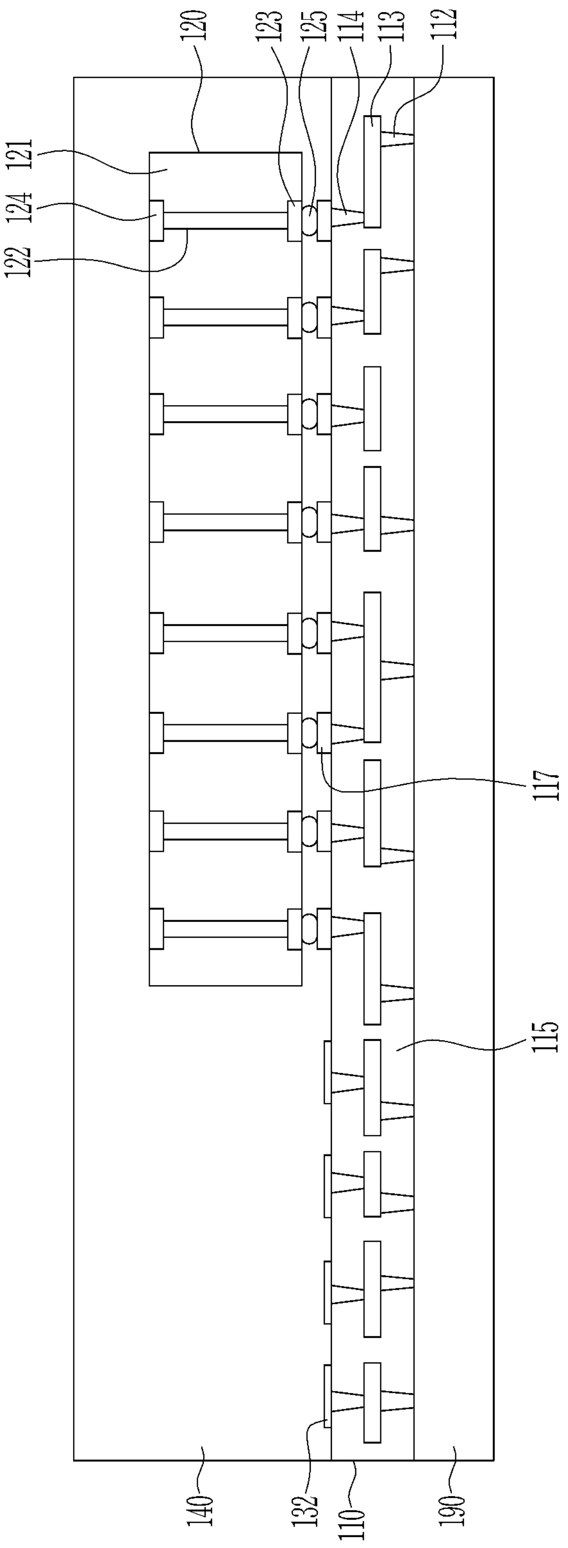

FIG. 9 is a cross-sectional view illustrating a step of molding the first semiconductor chip die 120 as one of steps of the method for manufacturing the 3D integrated circuit (3DIC) structure 100.

Referring to FIG. 9, the first semiconductor chip die 120 may be molded with the first molding material 140 on the front side redistribution layer (FRDL) structure 110. For example, the first molding material 140 extend around the first semiconductor chip die 120. In some embodiments, the first semiconductor chip die 120 may be disposed in the first molding material 140. In some embodiments, a process of molding with the first molding material 140 may include a compression molding or transfer molding process. In some embodiments, the first molding material 140 may include, for example, a thermosetting resin, such as an epoxy resin. In some embodiments, the first molding material 140 may include an epoxy molding compound (EMC). However, the embodiments of the first molding material 140 of this inventive concept are not limited thereto.

Figure 10:
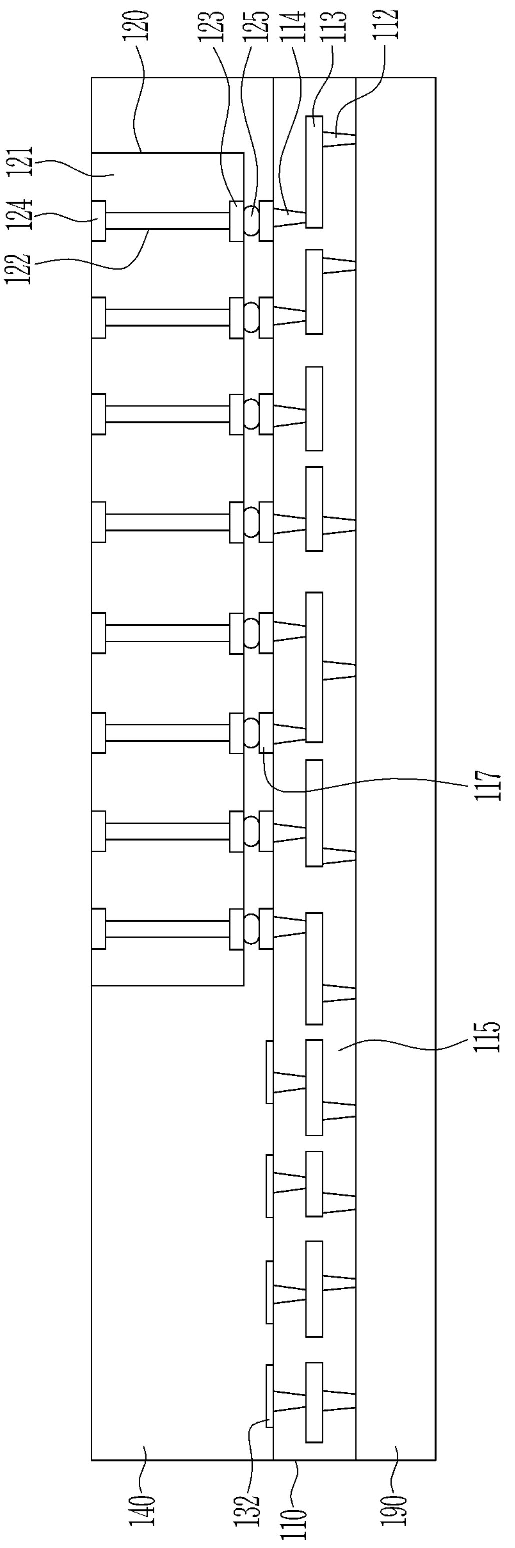

FIG. 10 is a cross-sectional view showing a step of planarizing an upper surface of the first molding material 140 as one of steps of the method for manufacturing the 3D integrated circuit (3DIC) structure 100.

Referring to FIG. 10, chemical mechanical polishing (CMP) may be performed to adjust a level of an upper surface of the first molding material 140. The upper surface of the first molding material 140 may be planarized by applying a CMP process or a mechanical grinding process, and an upper surface of the first semiconductor chip die 120 may be exposed.

Figure 11:
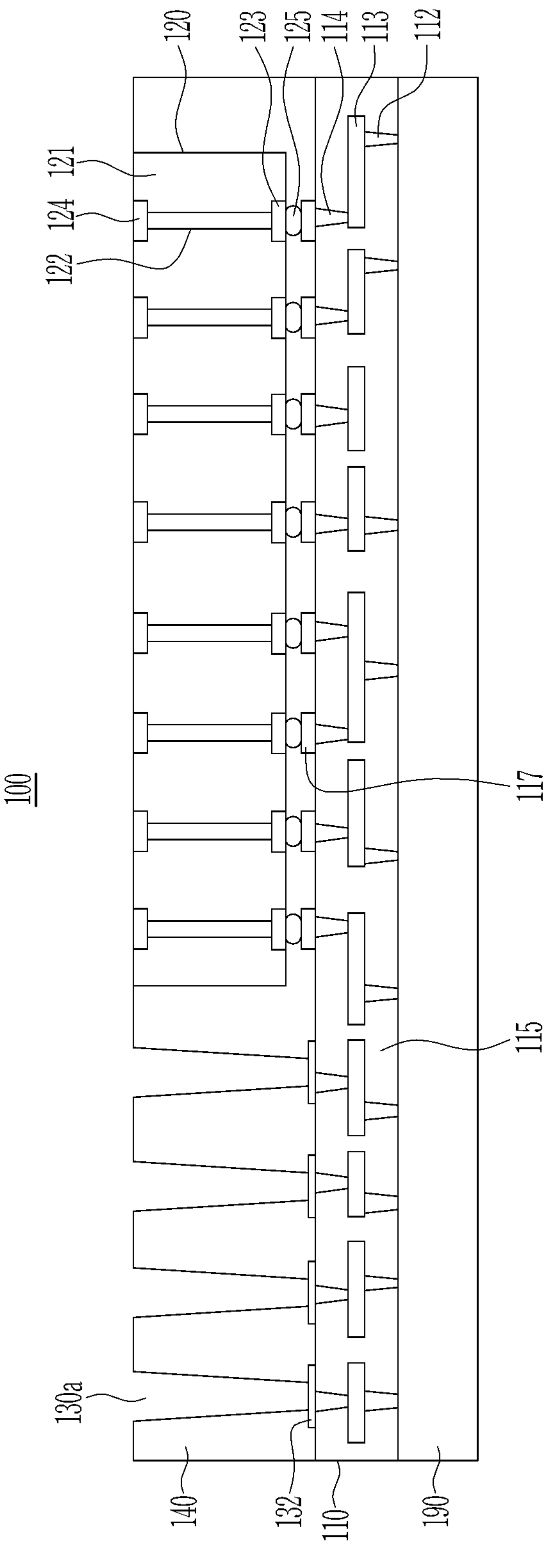

FIG. 11 is a cross-sectional view showing a step of forming through holes **130*a* in the first molding material 140 as one of steps of the method for manufacturing the 3D integrated circuit (3DIC) structure 100**.

Referring to FIG. 11, the through holes **130*a* may be disposed within the first molding material 140. In some embodiment, the through hole 130*a* may be formed by laser drilling. In some embodiments, the laser drilling may be performed with, for example, a carbon dioxide ($CO_2$) laser, an ultraviolet (UV) laser, or an excimer laser. After the laser drilling is performed, a width of an uppermost portion of the through hole 130*a* in the horizontal direction in a cross-sectional view may be greater than or equal to a width of a lowermost portion of the through hole 130*a* in the horizontal direction in a cross-sectional view. For example, the width of the through hole 130*a* in the horizontal direction in a cross-sectional view may increase as a distance from the sacrificial pad 132 on the upper surface of the first dielectric layer 115 increases in the vertical direction. In some embodiments, when the carbon dioxide ($CO_2$) laser is used, the width of the uppermost portion of the through hole 130*a* may be about 80 μm, and the width of the lowermost portion of the through hole 130*a* may be about 40 μm. In some embodiments, when the ultraviolet (UV) laser is used, the width of the uppermost portion of the through hole 130*a* may be about 35 μm, and the width of the lowermost portion of the through hole 130*a* may be about 20 μm. In some embodiments, the through hole 130*a* may be formed by mechanical drilling. In some embodiments, the through hole 130*a*** may be formed by an etching process.

When the through holes **130*a* are formed in the first molding material 140 by the laser drilling, the sacrificial pads 132 may protect the front side redistribution layer (FRDL) structure 110 from the laser and serve to form the through holes 130*a* having a uniform depth by preventing the laser from penetrating beyond (e.g., below) the sacrificial pad 132**.

After the through holes **130*a* are formed, desmear treatment may be performed to remove a residue remaining in the through holes 130*a***.

Figure 12:
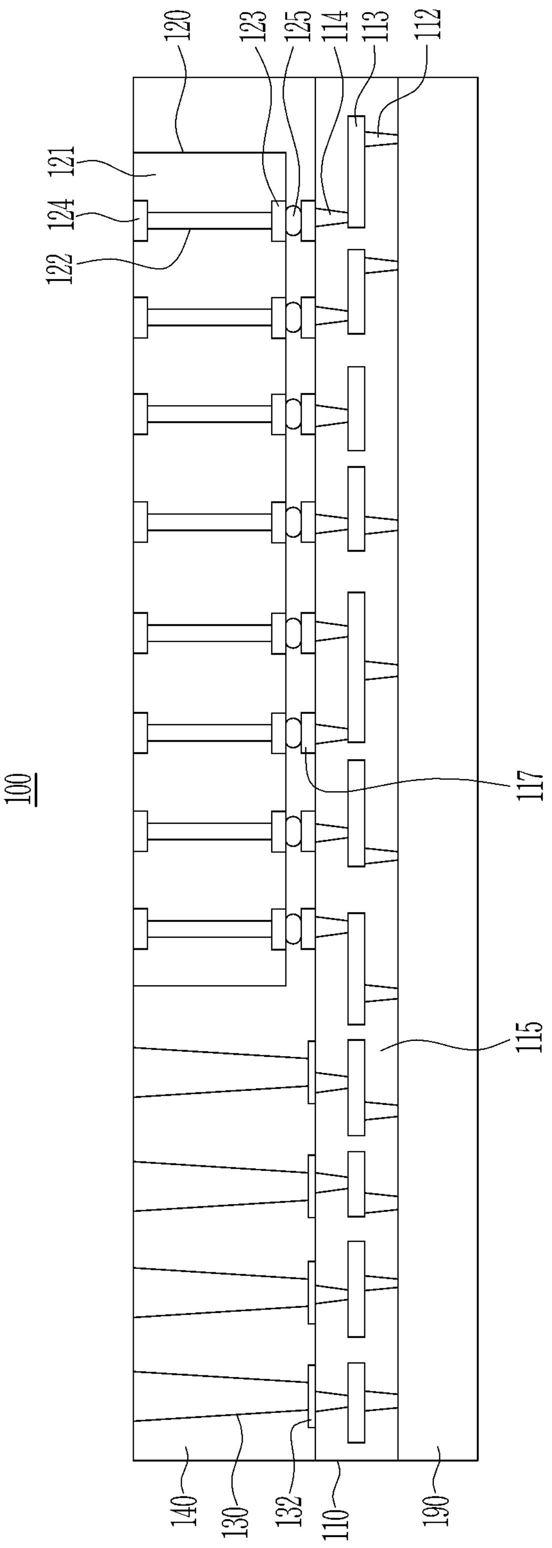

FIG. 12 is a cross-sectional view showing a step of filling the through holes **130*a* with a conductive material as one of steps of the method for manufacturing the 3D integrated circuit (3DIC) structure 100**.

Referring to FIG. 12, conductive posts 130 may be formed by filling the through holes **130*a* with a conductive material. In some embodiments, a width of an uppermost portion of a conductive post 130 in the horizontal direction in a cross-sectional view may be greater than or equal to a width of a lowermost portion of the conductive post 130 in the horizontal direction in a cross-sectional view. In some embodiments, the conductive material may include a conductive paste. In the embodiment in which the through holes 130***a* are filled with the conductive paste, the through holes 130*a* may be filled with the conductive paste by pushing the conductive paste into the through holes 130*a* using conductive paste printing. In some embodiments, the conductive material may include, for example, copper or a copper alloy, but is not limited thereto. In the embodiment in which copper or the copper alloy is used to fill the through holes 130*a*, a seed metal layer may be formed within the through holes 130*a*, and electroplating may be performed to fill the through holes 130*a* with copper or the copper alloy. In some embodiments, the through hole 130*a* may be filled by performing a sputtering process.

Figure 13:
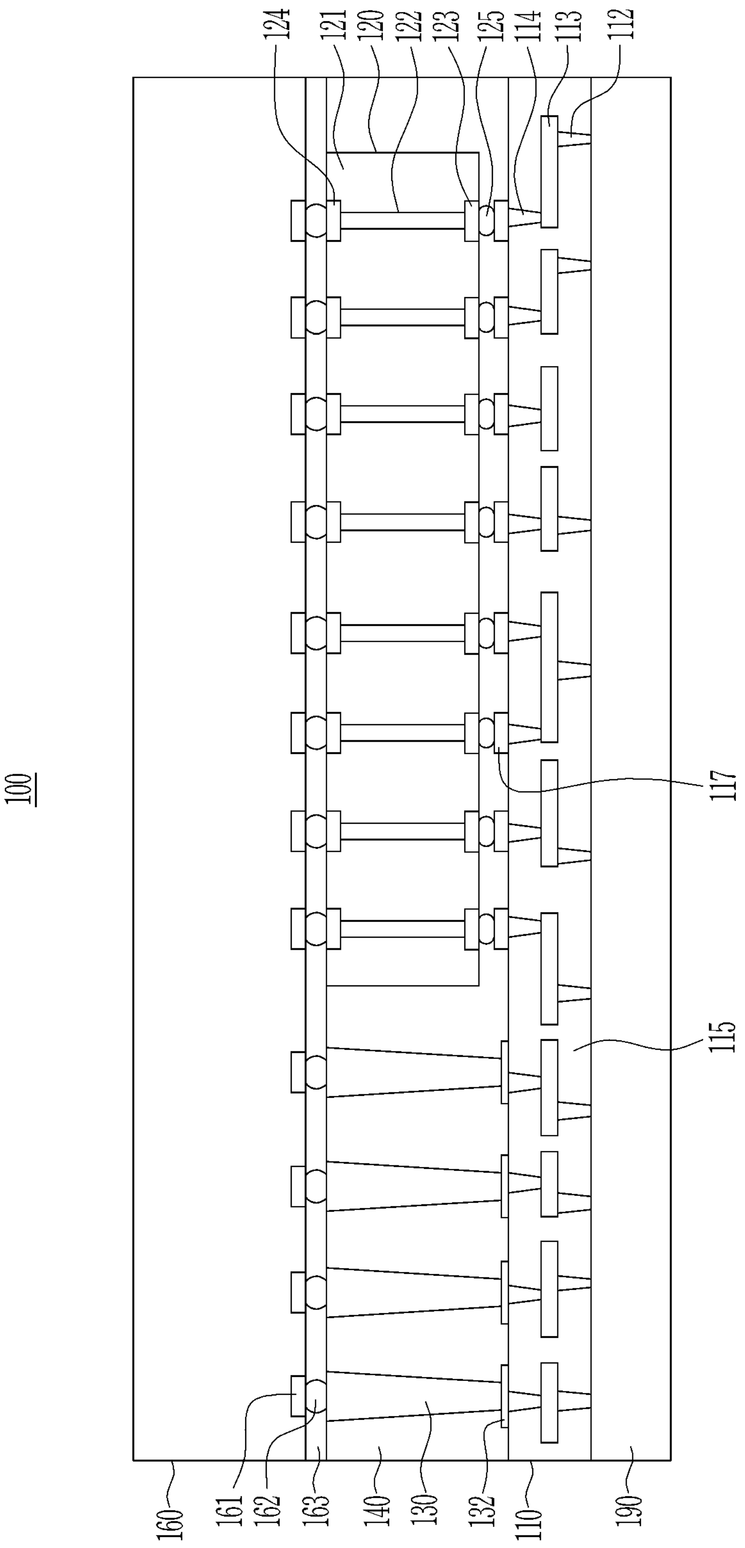
FIG. 13 is a cross-sectional view illustrating a step of the method for manufacturing the 3D integrated circuit (3DIC) structure according to some embodiments of the present inventive concept and follows FIG. 12.

FIG. 13 is a cross-sectional view illustrating a step of positioning (e.g., bonding or providing) the second semiconductor chip die 160 on the first semiconductor chip die 120 and the conductive posts 130 using the first connection member 162 as one of steps of the method for manufacturing the 3D integrated circuit (3DIC) structure 100, and follows FIG. 12.

Referring to FIG. 13, the second semiconductor chip die 160 may be disposed (e.g., bonded) on the first semiconductor chip die 120 and the conductive posts 130. The upper bonding pads 124 of the first semiconductor chip die 120 and the third bonding pads 161 of the second semiconductor chip die 160 may be bonded by the first connection members 162 and the conductive posts 130 and the third bonding pads 161 of the second semiconductor chip die 160 may be bonded by the first connection members 162. In some embodiments, the first connection member 162 may include a micro-bump, but is not limited thereto.

The insulating member 163 may be disposed between the first semiconductor chip die 120 and the second semiconductor chip die 160 and the insulating member 163 may be disposed between the conductive posts 130 and the second semiconductor chip die 160. The insulating member 163 may extend around (e.g., surround) the first connection members 162. The insulating member 163 may be disposed between the first semiconductor chip die 120 and the second semiconductor chip die 160 and between the conductive posts 130 and the second semiconductor chip die 160, so that stress that may occur between the conductive posts 130 and the second semiconductor chip die 160 may be improved (e.g., reduced).

In the embodiment for disposing the insulating member 163, before the second semiconductor chip die 160 is bonded to the first semiconductor chip die 120 and the conductive posts 130, the insulating member 163 may be attached on the planarized molding material 140. The insulating member 163 may include a non-conductive film (NCF). The non-conductive film (NCF) may have adhesiveness and may be attached to the first molding material 140. The non-conductive film (NCF) may have an unhardened state that may be deformed by an external force. The non-conductive film (NCF) may be attached to the first molding material 140 by heating the non-conductive film (NCF) at a temperature of about 170° C. to about 300° C. for about 1 second to about 20 seconds. Next, the second semiconductor chip die 160 may be stacked on the non-conductive film (NCF). The first connection member 162 provided by the second semiconductor chip die 160 may pass through the non-conductive film NCF to come in contact with the conductive post 130 and the first semiconductor chip die 120.

In some embodiments for disposing the insulating member 163, after the second semiconductor chip die 160 is bonded to the first semiconductor chip die 120 using the first connection member 162, a space between the first semiconductor chip die 120 and the second semiconductor chip die 160 may be filled with a molded under-fill (MUF).

Figure 14:
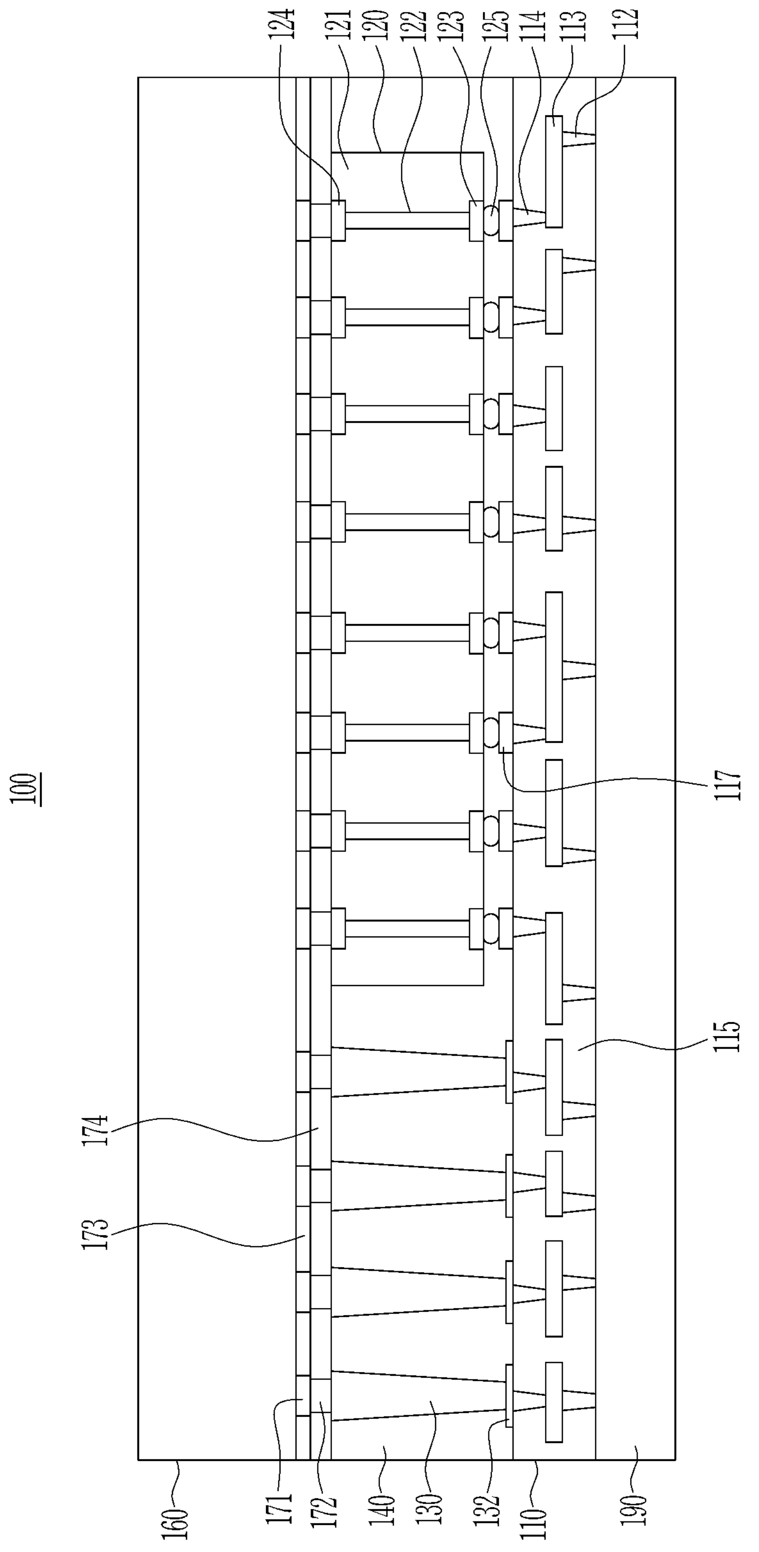
FIG. 14 is a cross-sectional view illustrating a step of the method for manufacturing the 3D integrated circuit (3DIC) structure according to some embodiments of the present inventive concept and follows FIG. 12.

FIG. 14 is a cross-sectional view illustrating a step of positioning (e.g., bonding or providing) the second semiconductor chip die 160 on the first semiconductor chip die 120 and the conductive posts 130 using the hybrid bonding as one of steps of the method for manufacturing the 3D integrated circuit (3DIC) structure 100, and follows FIG. 12.

Referring to FIG. 14, the fourth bonding pad 171 and the first silicon insulating layer 173 may be disposed at a lower portion of the second semiconductor chip die 160, and the fifth bonding pad 172 and the second silicon insulating layer 174 may be disposed at upper portion of the first semiconductor chip die 120 and the conductive posts 130. The fourth bonding pad 171 at a lower portion of the second semiconductor chip die 160 may be bonded to the fifth bonding pads 172 at upper portions of the first semiconductor chip die 120 and the conductive posts 130 by the hybrid bonding, and the first silicon insulating layer 173 at a lower portion of the second semiconductor chip die 160 may be bonded to the second silicon insulating layer 174 at upper portions of the first semiconductor chip die 120 and the conductive posts 130 by the hybrid bonding. The hybrid bonding may bond two devices by fusing the same materials of the two devices using a bonding property of the same material. The hybrid bonding means bonding the two devices by two different types, and for example, means bonding the two devices with a first type of metal-metal bonding and a second type of non-metal-non-metal bonding.

The fourth bonding pad 171 at the lower portion of the second semiconductor chip die 160 may be directly bonded to the fifth bonding pads 172 at the upper portions of the first semiconductor chip die 120 and the conductive posts 130 by the metal-metal hybrid bonding. Metal bonding may be performed at an interface between the fourth bonding pad 171 at the lower portion of the second semiconductor chip die 160 and the fifth bonding pads 172 at the upper portions of the first semiconductor chip die 120 and between the fourth bonding pad 171 and the conductive posts 130 by the metal-metal hybrid bonding. The fourth bonding pad 171 at the lower portion of the second semiconductor chip die 160 and the fifth bonding pads 172 at the upper portions of the first semiconductor chip die 120 and the conductive posts 130 may include the same material so that after the hybrid bonding, there may be no interface between the fourth bonding pad 171 at the lower portion of the second semiconductor chip die 160 and the fifth bonding pads 172 at the upper portions of the first semiconductor chip die 120 and between the fourth bonding pad 171 and the conductive posts 130. The first semiconductor chip die 120 and the second semiconductor chip die 160 may be electrically connected to each other through the fourth bonding pad 171 at the lower portion of the second semiconductor chip die 160, the fifth bonding pads 172 at the upper portions of the first semiconductor chip die 120, and the conductive posts 130.

The first silicon insulating layer 173 at the lower portion of the second semiconductor chip die 160 and the second silicon insulating layer 174 at the upper portions of the first semiconductor chip die 120 may be directly bonded by the non-metal-non-metal hybrid bonding. Covalent bonding may be performed at an interface between the first silicon insulating layer 173 at the lower portion of the second semiconductor chip die 160 and the second silicon insulating layer 174 at the upper portions of the first semiconductor chip die 120. The first silicon insulating layer 173 at the lower portion of the second semiconductor chip die 160 and the second silicon insulating layer 174 at the upper portions of the first semiconductor chip die 120 may be include the same material so that after the hybrid bonding, there may be no interface between the first silicon insulating layer 173 at the lower portion of the second semiconductor chip die 160 and the second silicon insulating layer 174 at the upper portions of the first semiconductor chip die 120.

Through the step of bonding by performing the hybrid bonding, the second semiconductor chip die 160 may be vertically stacked on the first semiconductor chip die 120 and the conductive post 130.

Figure 15:
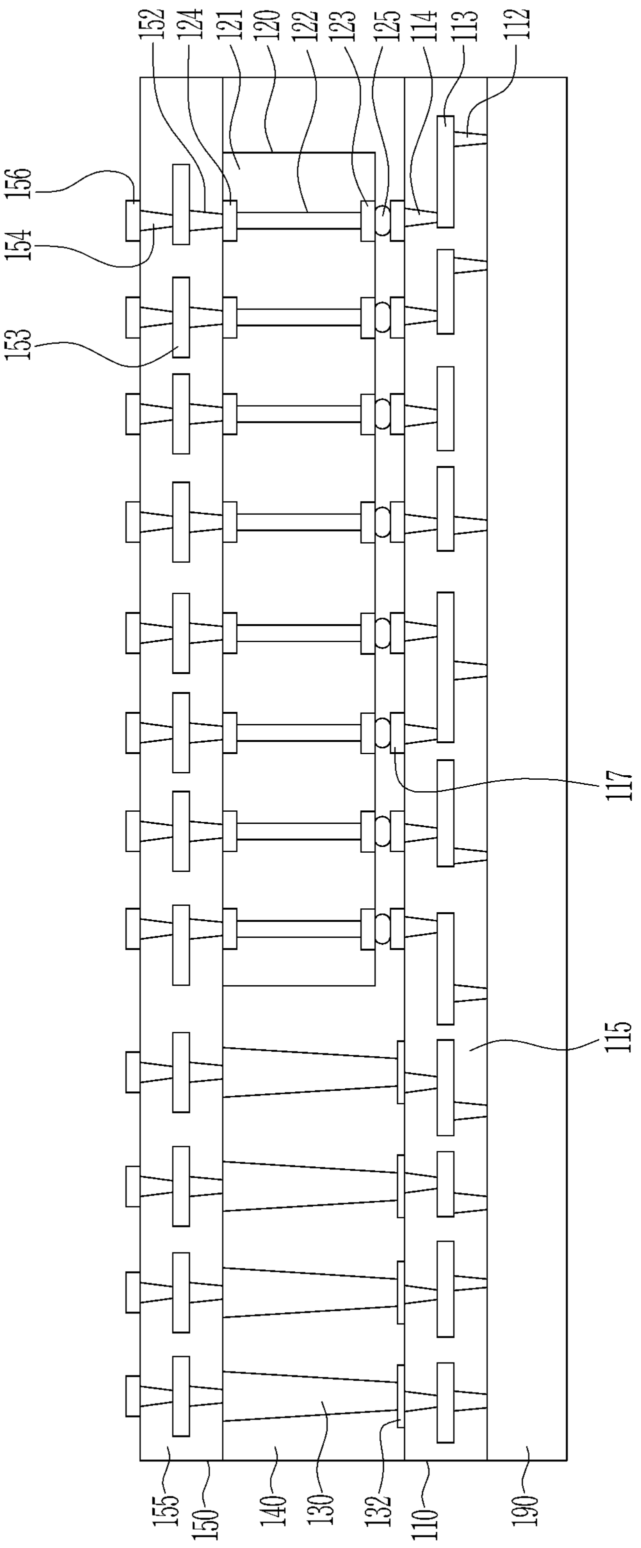
FIG. 15 is a cross-sectional view illustrating a step of the method for manufacturing the 3D integrated circuit (3DIC) structure according to some embodiments of the present inventive concept and follows FIG. 12.

FIG. 15 is a cross-sectional view illustrating a step of positioning (e.g., providing) the back side redistribution layer (BRDL) structure 150 on an upper surface of the planarized first molding material 140, an upper surface of the first semiconductor chip die 120, and upper surfaces of the conductive posts 130 as one of steps of the method for manufacturing the 3D integrated circuit (3DIC) structure 100, and follows FIG. 12.

Referring to FIG. 15, the back side redistribution layer (BRDL) structure 150 may be disposed on the upper surface of the planarized first molding material 140, the upper surface of the first semiconductor chip die 120, and the upper surfaces of the conductive posts 130.

First, the second dielectric layer 155 may be disposed on the upper surface of the planarized first molding material 140, the upper surface of the first semiconductor chip die 120, and the upper surfaces of the conductive posts 130. In some embodiments, the back side redistribution layer (BRDL) structure 150 may include a photosensitive polymer layer. In some embodiments, the back side redistribution layer (BRDL) structure 150 may include a photoimageable dielectric (PID) used in a redistribution process. As an example, the photoimageable dielectric (PID) may include a polyimide-based photosensitive polymer, a novolac-based photosensitive polymer, polybenzoxazole, a silicone-based polymer, an acrylate-based polymer, or an epoxy-based polymer, but is not limited thereto. In some embodiments, the photoimageable dielectric (PID) may have a resolution of about 3 μm. In some embodiments, the second dielectric layer 155 may include a polymer such as PBO, polyimide, or the like. In some embodiments, the second dielectric layer 155 may include, for example, an inorganic dielectric material such as a silicon nitride, a silicon oxide, or the like. In some embodiments, the second dielectric layer 155 may be formed by a CVD, ALD, or PECVD process, but is not limited thereto.

After the second dielectric layer 155 is formed, via holes may be formed by selectively etching the second dielectric layer 155, and the third redistribution vias 152 may be formed by filling the via holes with a conductive material.

Next, the second dielectric layer 155 may be additionally deposited on the third redistribution vias 152 and the previously deposited second dielectric layer 155, the additionally deposited second dielectric layer 155 may be selectively etched to form openings, and the second redistribution lines 153 may be formed by filling the openings with a conductive material.

Next, the second dielectric layer 155 may be additionally deposited on the second redistribution lines 153 and the previously deposited second dielectric layer 155, the additionally deposited second dielectric layer 155 may be selectively etched to form via holes, and the fourth redistribution vias 154 may be formed by filling the via holes with a conductive material.

In some embodiments, the third redistribution vias 152, the second redistribution lines 153, and the fourth redistribution vias 154 may include, for example, copper, aluminum, tungsten, nickel, gold, tin, titanium, and/or an alloy thereof. In some embodiments, the third redistribution vias 152, the second redistribution lines 153, and the fourth redistribution vias 154 may be formed by performing a sputtering process. In some embodiments, the third redistribution vias 152, the second redistribution lines 153, and the fourth redistribution vias 154 may be formed by performing an electroplating process after forming a seed metal layer.

Thereafter, the sixth bonding pads 156 may be disposed on the second dielectric layer 155 to be electrically connected (e.g., coupled) to the fourth redistribution vias 154 of the back side redistribution layer (BRDL) structure 150. The sixth bonding pads 156 may include, for example, copper, aluminum, silver, tin, gold, nickel, lead, titanium, and/or an alloy thereof. In some embodiments, the sixth bonding pads 156 may be formed by performing a sputtering process. In some embodiments, the sixth bonding pads 156 may be formed by performing an electroplating process after forming a seed metal layer.

Figure 16:
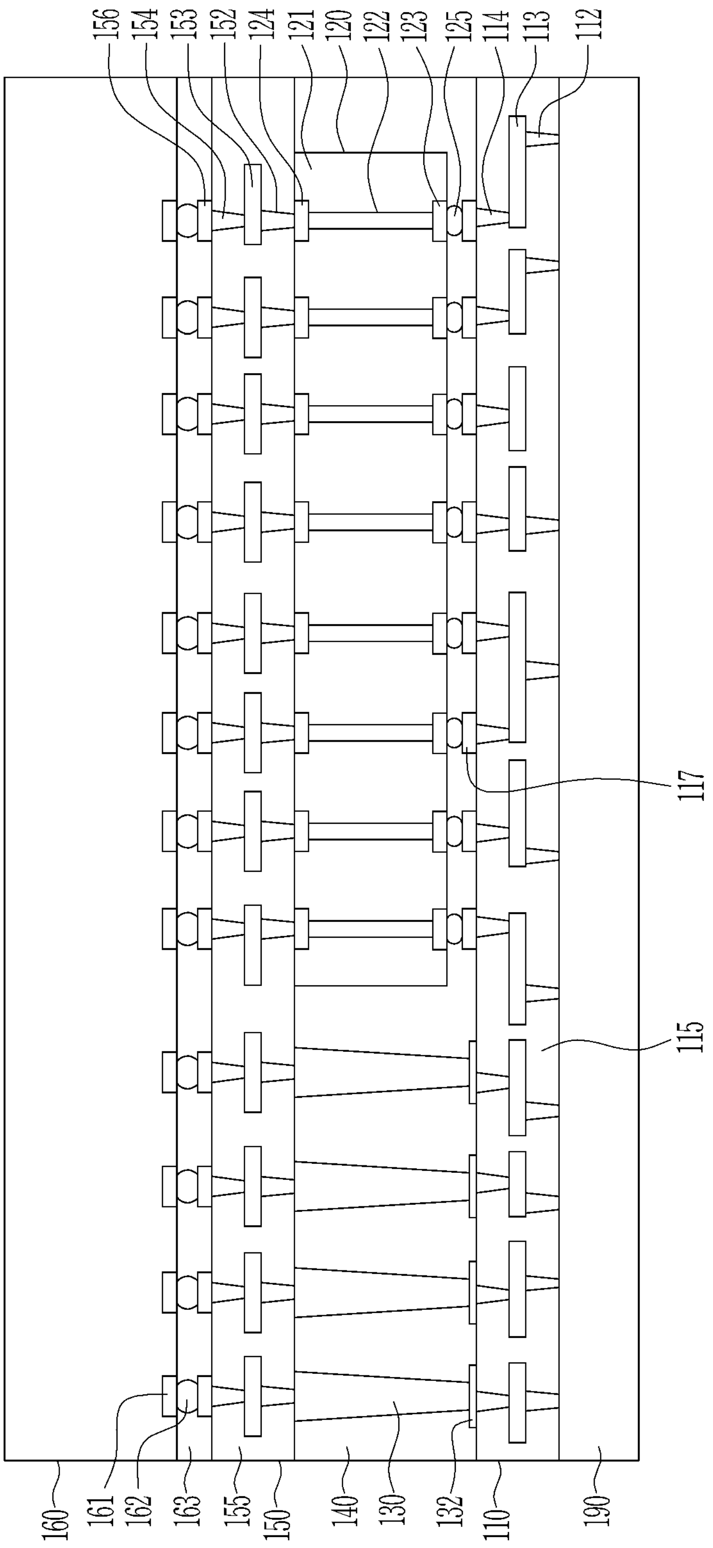
FIG. 16 is a cross-sectional view illustrating a step of the method for manufacturing the 3D integrated circuit (3DIC) structure according to some embodiments of the present inventive concept and follows FIG. 15.

FIG. 16 is a cross-sectional view illustrating a step of positioning (e.g., bonding or providing) the second semiconductor chip die 160 on the back side redistribution layer (BRDL) structure 150 using the first connection member 162 as one of a steps of the method for manufacturing the 3D integrated circuit (3DIC) structure 100, and follows FIG. 15.

Referring to FIG. 16, the second semiconductor chip die 160 may be bonded on the back side redistribution layer (BRDL) structure. The sixth bonding pads 156 of the back side redistribution layer (BRDL) structure and the third bonding pads 161 of the second semiconductor chip die 160 may be bonded using the first connection members 162. In some embodiments, the first connection member 162 may include a micro-bump, but is not limited thereto.

Figure 17:
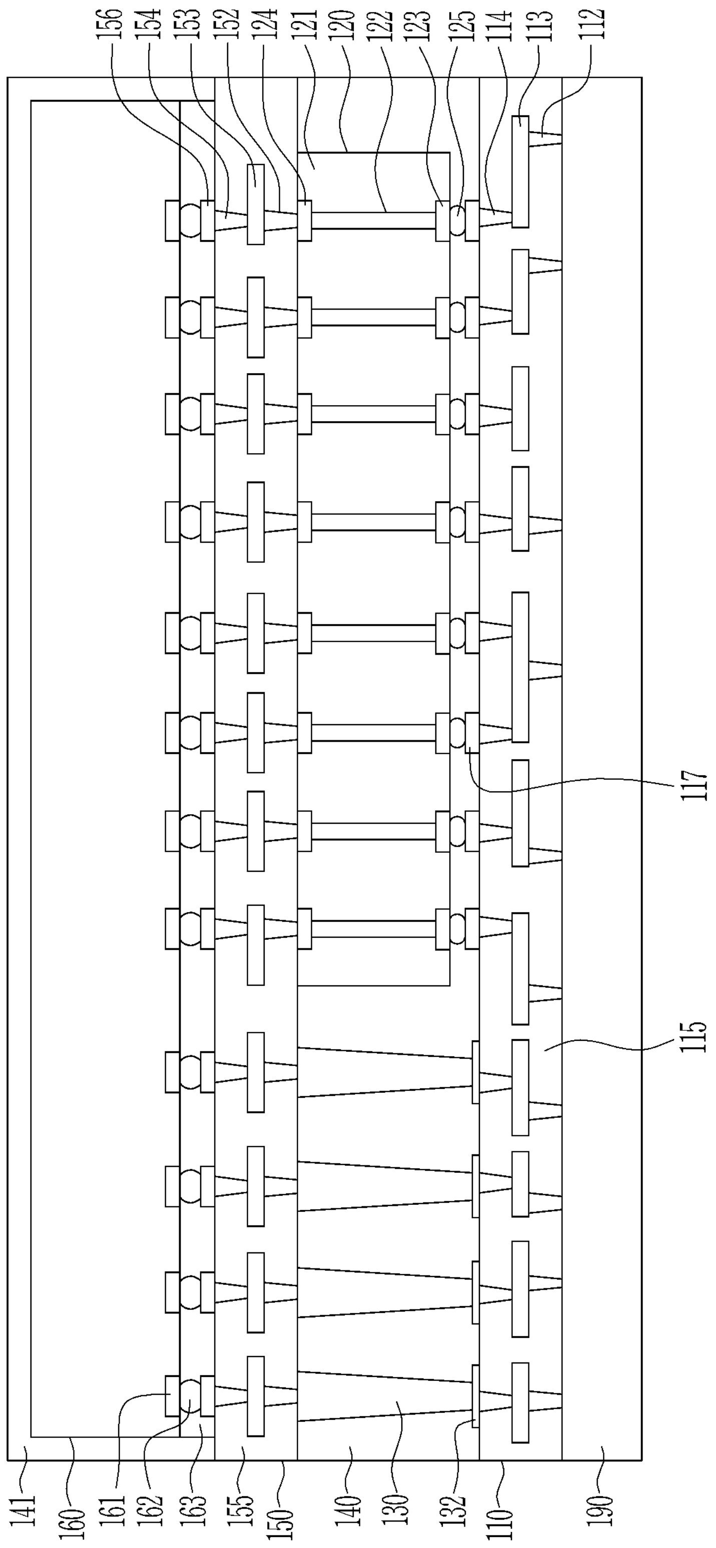
FIG. 17 is a cross-sectional view illustrating a step of the method for manufacturing the 3D integrated circuit (3DIC) structure according to some embodiments of the present inventive concept and follows FIG. 15.

FIG. 17 is a cross-sectional view illustrating a step of positioning (e.g., bonding or providing) the second semiconductor chip die 160 on the back side redistribution layer (BRDL) structure 150 using the first connection member 162 and molding the second semiconductor chip die 160 as one of steps of the method for manufacturing the 3D integrated circuit (3DIC) structure 100, and follows FIG. 15.

Referring to FIG. 17, the second semiconductor chip die 160 may be molded on the back side redistribution layer (BRDL) structure 150 by the second molding material 141. In some embodiments, a process of molding with the second molding material 141 may include a compression molding or transfer molding process. In some embodiments, the second molding material 141 may include a thermosetting resin such as an epoxy resin. In some embodiments, the second molding material 141 may include an epoxy molding compound (EMC). However, the embodiments of the second molding material 141 of this inventive concept are not limited thereto.

Figure 18:
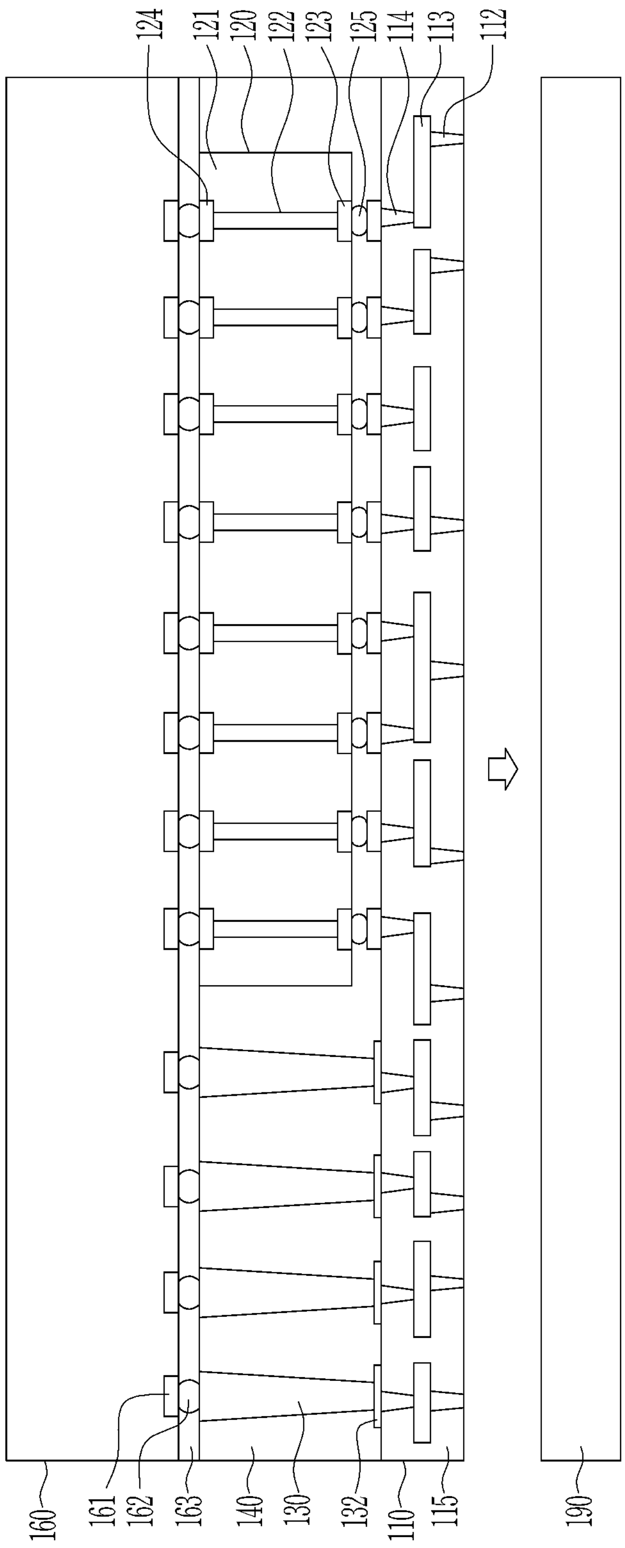
FIG. 18 is a cross-sectional view illustrating a step of the method for manufacturing the 3D integrated circuit (3DIC) structure according to some embodiments of the present inventive concept.

FIG. 18 is a cross-sectional view showing a step of removing (e.g., debonding) the carrier 190 from a lower surface of the front side redistribution layer (FRDL) structure 110 as one of steps of the method for manufacturing the 3D integrated circuit (3DIC) structure 100.

Referring to FIG. 18, the carrier 190 may be debonded from the lower surface of the front side redistribution layer (FRDL) structure 110.

Thereafter, as shown in FIG. 1, the external connection member 116 may be disposed on (e.g., lower surface of) the front side redistribution layer (FRDL) structure 110. Referring to FIG. 1, the insulating layer 119 may be disposed on (e.g., lower surface of) the first dielectric layer 115 of the front side redistribution layer (FRDL) structure 110, and the second bonding pads 111 may be formed on the first redistribution vias 112. In some embodiments, the insulating layer 119 may be a solder resist. The insulating layer 119 may include a plurality of openings for soldering of the external connection member 116 and the second bonding pad 111. In some embodiments, the second bonding pad 111 may include, for example, copper, nickel, zinc, gold, silver, platinum, palladium, chromium, titanium, and/or an alloy thereof. In some embodiments, the external connection member 116 may include, for example, tin, silver, lead, nickel, copper, and/or an alloy thereof.

While this disclosure has been described in connection with what is presently considered to be practical embodiments, it is to be understood that the disclosure is not limited to the disclosed embodiments, but, on the contrary, is intended to cover various modifications and equivalent arrangements included within the scope of the appended claims.

What is claimed is:

1. A three-dimensional (3D) integrated circuit structure, comprising:

a redistribution layer structure;

a first semiconductor chip die on the redistribution layer structure;

a plurality of sacrificial pads directly on the redistribution layer structure;

a plurality of conductive posts disposed adjacent the first semiconductor chip die, wherein the plurality of conductive posts is on the plurality of sacrificial pads, respectively;

a molding material that is on the first semiconductor chip die, the plurality of sacrificial pads, the plurality of conductive posts, and the redistribution layer structure;

an interconnection structure on the molding material; and a second semiconductor chip die on the interconnection structure, the interconnection structure electrically connecting the first semiconductor chip die and the second semiconductor chip die through the molding material, wherein the second semiconductor chip die overlaps the first semiconductor chip die and the plurality of conductive posts in a vertical direction.

2. The 3D integrated circuit structure of claim 1, wherein a width of an uppermost portion of a conductive post among the plurality of conductive posts is greater than or equal to a width of a lowermost portion of the conductive post.

3. The 3D integrated circuit structure of claim 1, wherein the plurality of conductive posts include a hardened conductive paste.

4. The 3D integrated circuit structure of claim 1, wherein the plurality of sacrificial pads include a conductive material, and the conductive material includes aluminum, tungsten, and/or an alloy thereof.

5. The 3D integrated circuit structure of claim 1, wherein the plurality of conductive posts are adjacent a side surface of the first semiconductor chip die.

6. The 3D integrated circuit structure of claim 1, wherein a first subset of conductive posts of the plurality of conductive posts are adjacent a first side surface of the first semiconductor chip die, and a second subset of conductive posts of the plurality of conductive posts are adjacent a second side surface of the first semiconductor chip die.

7. A three-dimensional (3D) integrated circuit structure, comprising:

a first redistribution layer structure;

a molding material on the first redistribution layer structure;

an interconnection structure on the molding material;

a first semiconductor chip die in the molding material, wherein the first semiconductor chip die is electrically connected to the first redistribution layer structure and the interconnection structure;

a plurality of sacrificial pads in the molding material, wherein the plurality of sacrificial pads are directly connected to the first redistribution layer structure;

a plurality of conductive posts in the molding material, wherein the plurality of conductive posts are adjacent the first semiconductor chip die, and wherein the plurality of conductive posts are electrically connected to the plurality of sacrificial pads and the interconnection structure; and a second semiconductor chip die on the interconnection structure, the interconnection structure electrically connecting the first semiconductor chip die and the second semiconductor chip die through the molding material, wherein the second semiconductor chip die overlaps the first semiconductor chip die and the plurality of conductive posts in a vertical direction.

8. The 3D integrated circuit structure of claim 7, wherein the interconnection structure includes a second redistribution layer structure.

9. The 3D integrated circuit structure of claim 7, wherein the interconnection structure includes a micro-bump.

10. The 3D integrated circuit structure of claim 7, wherein the interconnection structure includes upper bonding pads and lower bonding pads.

11. The 3D integrated circuit structure of claim 10, wherein the upper bonding pads and the lower bonding pads are directly in contact with each other, respectively.

12. The 3D integrated circuit structure of claim 7, wherein the first semiconductor chip die includes a through silicon via (TSV).

* * * * *